United States Patent [19]

Kadoiwa et al.

[11] Patent Number: 5,544,187
[45] Date of Patent: Aug. 6, 1996

[54] MULTIQUANTUM BARRIER STRUCTURE AND SEMICONDUCTOR LASER DIODE

[75] Inventors: Kaoru Kadoiwa; Takashi Motoda; Manabu Kato, all of Itami, Japan

[73] Assignee: Mitsubishi Denki Kabushiki Kaisha, Tokyo, Japan

[21] Appl. No.: 343,909

[22] Filed: Nov. 17, 1994

[30] Foreign Application Priority Data

Nov. 25, 1993 [JP] Japan ..................................... 5-294861

[51] Int. Cl.⁶ ......................................................... H01S 3/19
[52] U.S. Cl. .................................................. 372/45; 372/46
[58] Field of Search ........................................ 372/46, 45

[56] References Cited

U.S. PATENT DOCUMENTS 5,362,974  11/1994  Irikawa et al. ............................ 372/46
5,425,041   6/1995  Seko et al. ................................. 372/45

Primary Examiner—Rodney B. Bovernick
Assistant Examiner—Yisun Song
Attorney, Agent, or Firm—Leydig, Voit & Mayer

[57] ABSTRACT

A multiquantum barrier (MQB) structure includes a first superlattice layer and a second superlattice layer disposed continuously with the first superlattice layer. The first superlattice layer includes well layers having the same thickness and barrier layers having the same thickness, the well layers and barrier layers being alternatingly laminated. The second superlattice layer includes well layers having the same thickness, the well and barrier layers being alternatingly laminated. The second superlattice layer has a high electron reflectivity in an electron energy region where the electron reflectivity of the second first superlattice structure is low. Therefore, the high reflectivity of the second superlattice layer compensates for the low reflectivity of the first superlattice layer whereby a high electron reflectivity is maintained in the MQB structure.

4 Claims, 18 Drawing Sheets

Fig. 20 (a) Prior Art
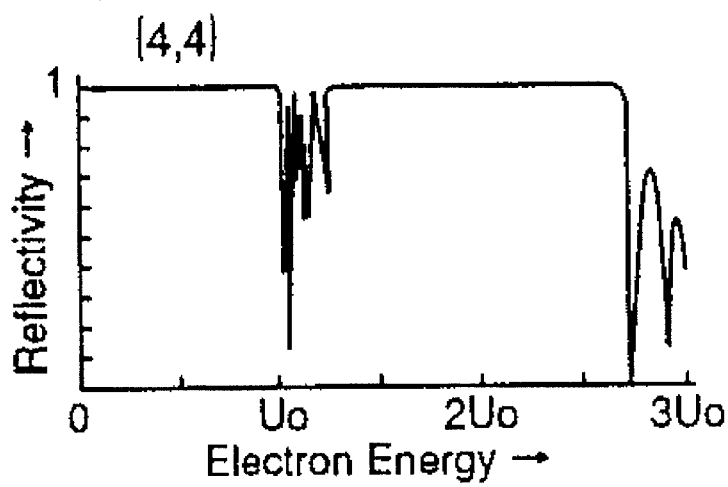
Fig. 20 (b) Prior Art
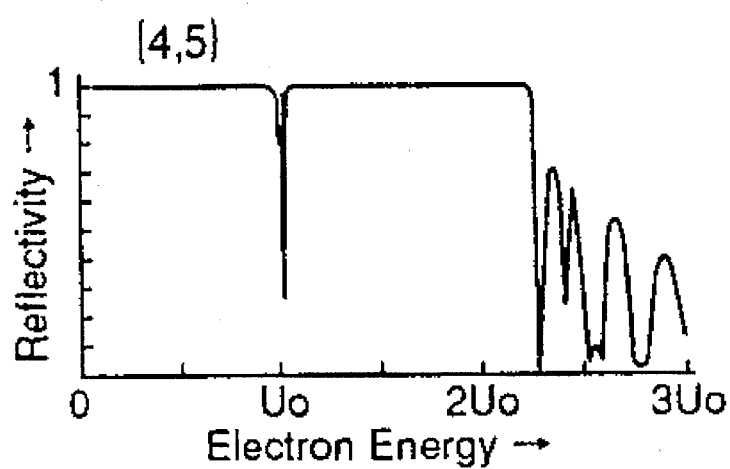
Fig. 20 (c) Prior Art
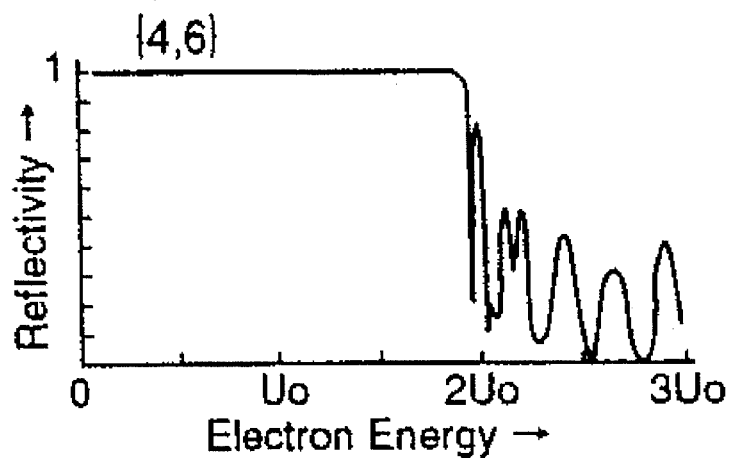

Fig.20 (d) Prior Art
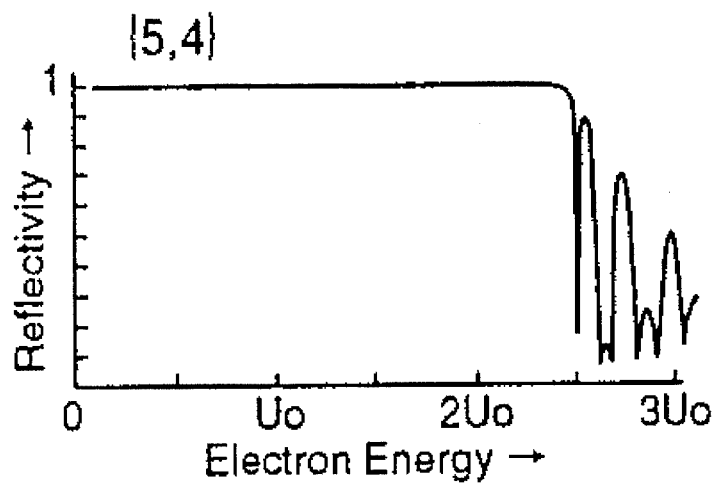
Fig.20 (e) Prior Art
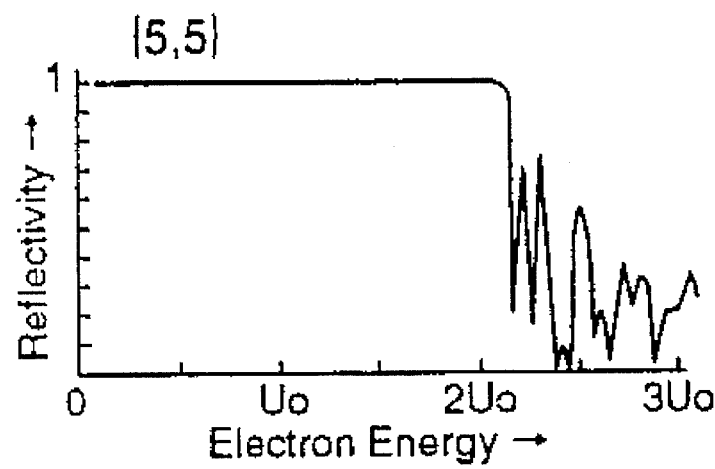
Fig.20 (f) Prior Art
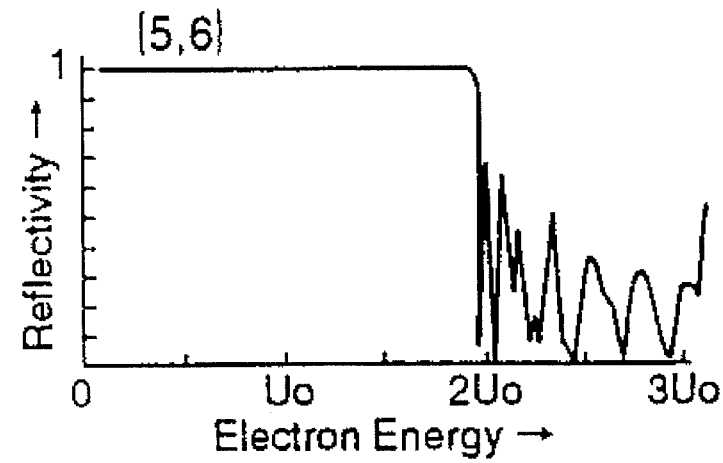

Fig.20 (g) Prior Art
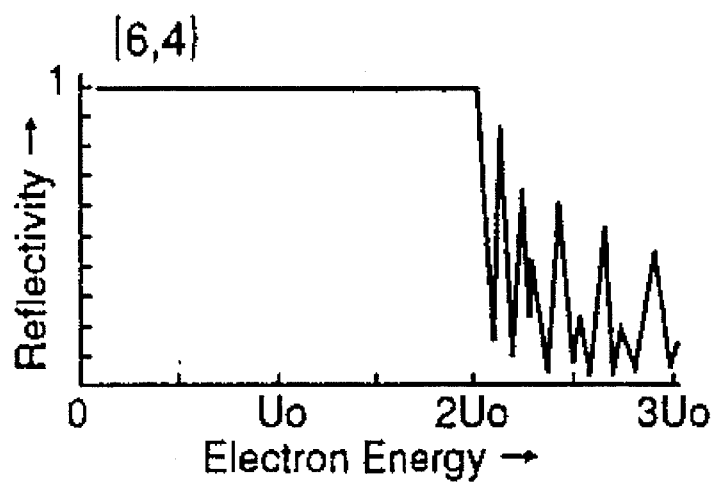
Fig.20 (h) Prior Art
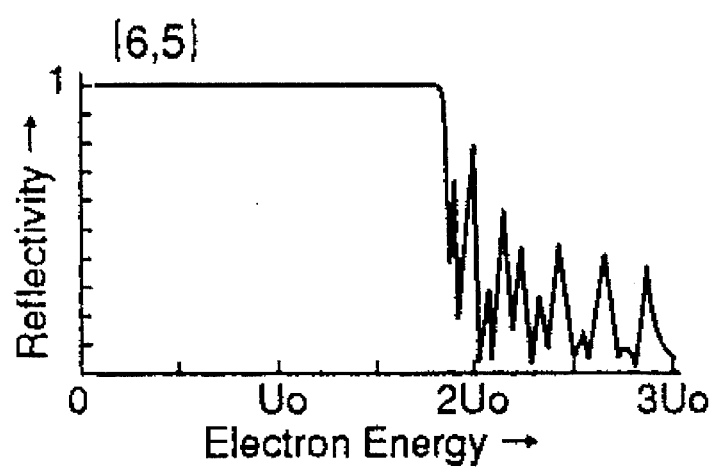
Fig.20 (i) Prior Art
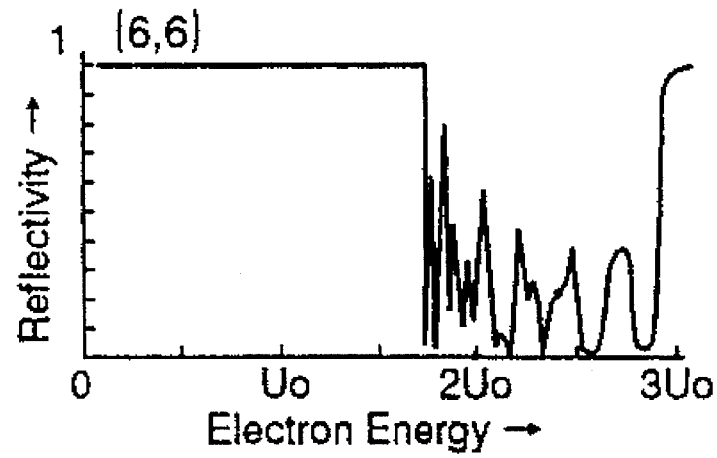

MULTIQUANTUM BARRIER STRUCTURE AND SEMICONDUCTOR LASER DIODE

FIELD OF THE INVENTION

The present invention relates to a multiquantum barrier (hereinafter referred to as MQB) structure and a semiconductor laser diode producing visible light (hereinafter referred to as a visible light semiconductor laser diode). More specifically, the invention relates to an MQB structure that provides a ratio of the energy of an effective potential barrier to the energy of a classical potential barrier much higher than that of a conventional MQB structure and that improves characteristics of a visible light semiconductor laser diode when it is interposed between an active layer and a cladding layer of the laser diode. The invention also relates to a visible light semiconductor laser diode having improved characteristics in which overflow of charge carriers from an active layer to a cladding layer is significantly suppressed.

BACKGROUND OF THE INVENTION

A multiquantum barrier is a kind of superlattice in which electron waves reflected at interfaces in the superlattice interfere with each other, whereby a virtual potential barrier to electrons, higher than the classical potential barrier of the semiconductors forming the superlattice, is produced.

FIG. 15 is a schematic diagram illustrating a prior art MQB structure disclosed in Japanese Published Patent Application No. Sho. 63-46788. FIG. 16 is an energy band diagram of the MQB structure of FIG. 15. In these figures, reference numeral 110a designates an AlAs layer having a thickness of 186.8 Å, numeral 110b designates AlAs layers each having a thickness of 28.3 Å, numeral 110c designates AlAs layers each having a thickness of 22.6 Å, numeral 110d designates AlAs layers each having a thickness of 17.0 Å, and numeral 111 designates GaAs layers each having a thickness of 56.5 Å. The AlAs layers 110a to 110d are quantum barrier layers, and the GaAs layers 111 are quantum well layers. In FIG. 16, reference character $U_e$ designates an effective potential barrier, and reference character $U_0$ designates a classical potential barrier.

In this prior art, the AlAs barrier layers 110a to 110d and the GaAs well layers 111 are alternatingly arranged with slightly varying thicknesses in the AlAs barrier layers. An effective potential barrier $U_e$ that reflects an electron 121 having an energy higher than the classical potential barrier $U_0$ than between an AlAs bulk layer and an GaAs bulk layer is produced utilizing an electron wave interference effect.

In this prior art, it is thought that the gradual reduction in the thicknesses of the barrier layers in the MQB structure provides a stepwise increase in the potential barrier. However, in fact, all electrons are reflected by the effective potential barrier at the boundary between the well layer 111 next to the thick first barrier layer 110a and the barrier layer 110b.

FIG. 17 is a graph illustrating calculated reflectivities of electrons incident on the MQB shown in FIG. 15. As shown in FIG. 17, the effective potential barrier $U_e$ produced in the prior art MQB is only 1.4 times as high as the classical potential barrier $U_0$.

On the other hand, high laser oscillation threshold current and degradation of output characteristics at a high temperature are problems in a conventional visible light semiconductor laser diode. FIG. 18 is an energy band diagram showing a conduction band edge structure of a conventional visible light semiconductor laser diode including a $Ga_{0.5}In_{0.5}P$ active layer and $(Al_{0.7}Ga_{0.3})_{0.5}In_{0.5}P$ upper and lower cladding layers in the vicinity of the active layer. In the figure, reference numeral 125 designates a $Ga_{0.5}In_{0.5}P$ active layer, numeral 126 designates an n type $(Al_{0.5}Ga_{0.3})_{0.5}In_{0.5}P$ cladding layer, and numeral 127 designates a p type $(Al_{0.7}Ga_{0.3})_{0.5}In_{0.5}P$ cladding layer.

The problems mentioned above are caused by overflow of injected carriers (electrons) from the active layer into the p type $(Al_{0.7}Ga_{0.3})_{0.5}In_{0.5}P$ cladding layer. The overflow is caused because the difference $\Delta E_c$ in the barrier height in the conduction band between the $Ga_{0.5}In_{0.5}P$ active layer and the $(Al_{0.7}Ga_{0.3})_{0.5}In_{0.5}P$ cladding layer is lower than 200 meV and the carrier concentration of the p type $(Al_{0.7}Ga_{0.3})_{0.5}In_{0.5}P$ cladding layer is only $5\times10^{17}$ cm$^{-3}$, at most.

As a method of suppressing charge carrier over-flow, an MQB structure may be interposed between the active layer and the cladding layer. In the MQB structure described above, however, since the effective potential barrier $U_s$ produced by the MQB is only 1.4 times as high as the classical potential barrier $U_0$, even when this MQB structure is employed in the visible light laser diode, only a little improvement in characteristics is achieved.

FIG. 19 is a diagram illustrating an MQB structure applied to a visible light laser diode disclosed in *Journal of Electronic Information Communication Society*, December 1991, Volume J74-C-I, Number 12, pages 527–535. In the FIGURE, the MQB structure comprises, alternatingly arranged, eleven $(Al_{0.7}Ga_{0.3})_{0.5}In_{0.5}P$ barrier layers 130 and ten $(Al_{0.7}Ga_{0.8})_{0.5}In_{0.5}P$ well layers 131.

The thickness of the first barrier layer 130 in the MQB is fixed at 80 monolayers (MLs), and the other barrier layers 130 are thinner than the first barrier layer and each of them has the same thickness. In addition, all of the well layers 131 are of the same thickness. Since the first barrier layer is as thick as 80 MLs, unwanted leakage of electrons due to tunneling is prevented. In this publication, the thickness of the barrier layers other than the first barrier layer and the thickness of the well layer are respectively varied, and the reflectivity of electrons in each case is calculated. FIGS. 20(a)–20(i) show the results of the calculations. In the figures, the thicknesses of the well layer and the barrier layer are shown as {well layer, barrier layer} at the top left-hand corner of each figure. The unit of the thickness is MLs.

As can be seen from FIG. 20(d), when the thickness of the well layer is 5 MLs and the thickness of the barrier layer is 4 MLs, the height of the effective potential barrier $U_e$ is about twice as high as the height of the classical potential barrier $U_0$.

In the described prior art MQB structure, the height of the effective potential barrier produced by the MQB is only twice as high as the height of the classical potential barrier. Therefore, even when the MQB structure is interposed between an active layer and a cladding layer of a visible light semiconductor laser diode to suppress unwanted overflow of carriers from the active layer to the cladding layer, the characteristics of the laser diode are not significantly improved.

SUMMARY OF THE INVENTION

It is an object of the present invention to provide an MQB structure that provides a ratio of a height of an effective potential barrier to a height of a classical potential barrier much higher than that obtained by a conventional MQB structure and that improves characteristics of a visible light semiconductor laser diode when it is interposed between an active layer and a cladding layer of the laser diode.

It is another object of the present invention to provide a visible light semiconductor laser diode with improved characteristics in which overflow of carriers from an active layer to a cladding layer is sufficiently suppressed.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, an MQB structure includes a first superlattice layer and a second superlattice layer disposed continuously on the first superlattice layer. The first superlattice layer comprises a plurality of well layers having the same thickness and a plurality of barrier layers having the same thickness, the well and barrier layers being alternatingly laminated. The second superlattice layer comprises a plurality of well layers having the same thickness and a plurality of barrier layers having the same thickness, the well and barrier layers being alternatingly laminated. The second superlattice layer has a high electron reflectivity in an electron energy region where the reflectivity of the first superlattice layer is low. Therefore, the high reflectivity part of the second superlattice layer compensates for the low reflectivity part of the first superlattice layer, whereby a high reflectivity to a high energy electron is maintained in the MQB structure.

According to a second aspect of the present invention, in the MQB structure, the thickness of the well layer of the second superlattice layer is the same as the thickness of the well layer of the first superlattice layer, and the thickness of the barrier layer of the second superlattice layer is different from the thickness of the barrier layer of the first superlattice layer. Therefore, the energy region where the electron reflectivity of the first superlattice layer is high is different from the energy region where the electron reflectivity of the second superlattice layer is high, so that a structure in which the high reflectivity part of the second superlattice layer compensates for the low reflectivity part of the first superlattice layer is easily realized, resulting in an MQB structure having a high reflectivity to a high energy electron.

According to a third aspect of the present invention, in the MQB structure, each of the first and second superlattice layers comprises, alternatingly arranged, four or more well layers and four or more barrier layers. Therefore, electrons incident on the superlattice layers sufficiently are surely reflected by the MQB structure.

According to a fourth aspect of the present invention, in the MQB structure, the well layers of the first and second superlattice layers comprise $Ga_{0.5}In_{0.5}P$, and the barrier layers of the first and second superlattice layers comprise $(Al_{0.7}Ga_{0.3})_{0.5}In_{0.5}P$. Therefore, this MQB structure can be applied to a visible light semiconductor laser diode including a $Ga_{0.5}In_{0.5}P$ active layer and an $(Al_{0.7}Ga_{0.3})_{0.5}In_{0.5}P$ cladding layer.

According to a fifth aspect of the present invention, in the MQB structure, the well layers of the first and second superlattice layers comprise $Ga_{0.5}In_{0.5}P$, and the barrier layers of the first and second superlattice layers comprise $(Al_{0.7}Ga_{0.3})_{0.5}In_{0.5}P$. In addition, the thickness of each well layer included in the first and second superlattice layers is equivalent to 4 MLs (=1.15 nm). Therefore, the height of the effective potential barrier is significantly increased compared to a case where the thickness of the well layer is different from 4 MLs.

According to a sixth aspect of the present invention, in the MQB structure, the well layers of the first and second superlattice layers comprise $Ga_{0.5}In_{0.5}P$, and the barrier layers of the first and second superlattice layers comprise $(Al_{0.7}Ga_{0.3})_{0.5}In_{0.5}P$. In addition, the thickness of each well layer included in the first and second superlattice layers is equivalent to 4 MLs (=1.15 nm), the thickness of each barrier layer included in the first superlattice layer is equivalent to 2 MLs (=0.58 nm), and the thickness of each barrier layer included in the second superlattice layer is equivalent to 4 MLs (=1.15 nm). Therefore, an MQB structure in which the effective potential barrier is 8 times as high as the classical potential barrier is realized.

According to a seventh aspect of the present invention, in the MQB structure, the well layers of the first and second superlattice layers comprise $Ga_{0.5}In_{0.5}P$, and the barrier layers of the first and second superlattice layers comprise $(Al_{0.5}Ga_{0.3})_{0.5}In_{0.5}P$. In addition, the thickness of each well layer included in the first and second superlattice layers is equivalent to 4 MLs (=1.15 nm), the thickness of each barrier layer included in the first superlattice layer is equivalent to 3 MLs (=0.86 nm), and the thickness of each barrier layer included in the second superlattice layer is equivalent to 5 MLs (=1.44 nm). Therefore, an MQB structure in which the effective potential barrier is 6 times as high as the classical potential barrier is realized.

According to an eighth embodiment of the present invention, in the MQB structure, the well layers of the first and second superlattice layers comprise $Ga_{0.5}In_{0.5}P$, and the barrier layers of the first and second superlattice layers comprise $(Al_{0.7}Ga_{0.3})_{0.5}In_{0.5}P$. The thickness of each well layer included in the first and second superlattice layers is equivalent to 4 MLs (=1.15 nm). The thickness of each barrier layer included in the first superlattice layer is equivalent to 2 MLs (=0.58 nm). The second superlattice layer comprises two superlattice layers. The thickness of each barrier layer included in one of the superlattice layers is equivalent to 4 MLs (=1.15 nm) and the thickness of the barrier layer included in the other superlattice layer is equivalent to 6 MLs (=1.73 nm). Therefore, an MQB structure in which the effective potential barrier is 8.5 times as high as the classical potential barrier is realized.

According to a ninth aspect of the present invention, in the MQB structure, the well layers of the first and second superlattice layers comprise $Ga_{0.5}In_{0.5}P$, and the barrier layers of the first and second superlattice layers comprise $(Al_{0.7}Ga_{0.3})_{0.5}In_{0.5}P$. The thickness of each well layer included in the first and second superlattice layers is equivalent to 4 MLs (=1.15 nm). The thickness of each barrier layer included in the first superlattice layer is equivalent to 3 MLs (=0.86 nm). The second superlattice layer comprises two superlattice layers. The thickness of each barrier layer included in one of the superlattice layers is equivalent to 4 MLs (=1.15 nm) and the thickness of the barrier layer included in the other superlattice layer is equivalent to 5 MLs (=1.44 nm). Therefore, an MQB structure in which the effective potential barrier is 10 times as high as the classical potential barrier is realized.

According to a tenth aspect of the present invention, in a visible light semiconductor laser diode including an active layer comprising AlGaInP and p type and n type AlGaInP cladding layers comprising AlGaInP and sandwiching the active layer, the MQB structure is interposed between the active layer and the p type cladding layer. Therefore, a visible light semiconductor laser diode in which the oscillation threshold is reduced and the output characteristics at a high temperature are improved is realized,

BRIEF DESCRIPTION OF THE DRAWINGS

FIGS. 20(a)–20(i) are graphs illustrating calculated electron reflectivities in the MQB structure shown in FIG. 19.

DETAILED DESCRIPTION OF THE PREFERRED EMBODIMENTS

Figure 1:
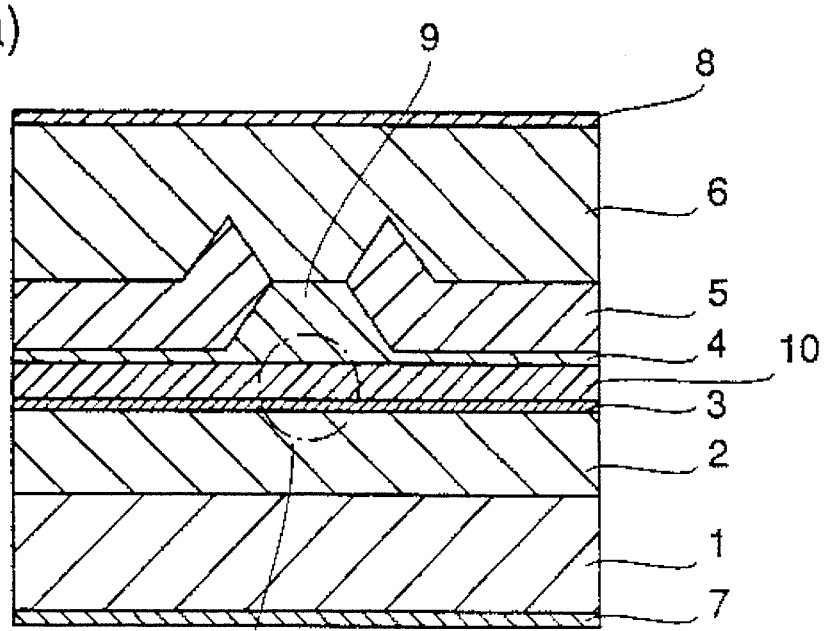
FIGS. 1(a) and 1(b) are sectional views illustrating a visible light semiconductor laser diode including an MQB structure according to the present invention.
Figure 1:
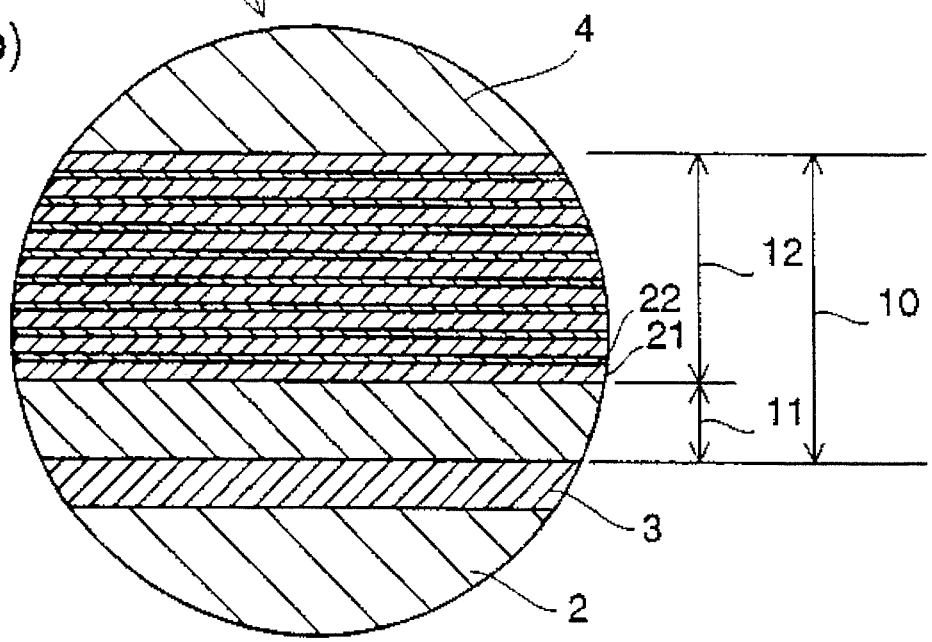

FIG. 1(a) is a sectional view of a visible light semiconductor laser diode taken perpendicular to the resonator length direction of the laser diode. The laser diode includes an MQB structure according to the present invention. FIG. 1(b) is an enlarged view of a part of the laser diode in the vicinity of the active layer.

An n type $(Al_{0.7}Ga_{0.3})_{0.5}In_{0.5}P$ lower cladding layer is disposed on an n type GaAs substrate 1. An MQB structure 10 is disposed on the active layer 3. As shown in FIG. 1(b), the MQB structure 10 comprises a superlattice structure 12 and a first barrier layer 11. In the superlattice structure 12, a plurality of $Ga_{0.5}In_{0.5}P$ well layers 21 and a plurality of $(Al_{0.5}Ga_{0.3})_{0.5}In_{0.5}P$ barrier layers 22 are alternatingly laminated. The first barrier layer 11 is interposed between the active layer 3 and the superlattice structure 12 and prevents electrons from passing through the superlattice structure 12 due to resonant tunneling. Hereinafter, the first barrier layer 11 is referred to as a tunneling preventing layer. A p type $(Al_{0.7}Ga_{0.3})_{0.5}In_{0.5}P$ upper cladding layer 4 is disposed on the MQB structure 10. The upper cladding layer 4 includes a stripe-shaped mesa portion 9 at the center of the structure. The stripe-shaped mesa portion 9 extends in the resonator length direction of the laser. An n type GaAs current blocking layer 5 is disposed on the upper cladding layer 4, contacting the opposite sides of the mesa portion 9. A p type GaAs cap layer 6 is disposed on the mesa portion 9 of the upper cladding layer 4 and on the current blocking layer 5. An n side electrode 7 is disposed on the rear surface of the substrate 1, and a p side electrode 8 is disposed on the cap layer 6.

In the MQB structure in which the quantum wells and the quantum barriers are periodically arranged, when electrons are injected into the MQB structure, electrons having energies larger than the height of the classical potential barrier pass through the MQB or are reflected in the MQB in a certain ratio. The electron wave interferes with the electron waves reflected at boundaries of the respective barriers.

In a simplified calculation, although the phase of the electron wave is not varied at the boundary before the electron reaches the barrier, the phase is varied by $\pi$ at the boundary after the electron reaches the barrier. Therefore, when the thicknesses of the well layer and the barrier layer are selected with regard to the effective mass of the electrons and the potential barrier $U_0$ of each layer so that the difference in phases between the reflected waves that interfere with each other is an odd integer multiple of $\pi$, a large reflectivity of the incident electrons is obtained.

When an MQB structure satisfying the described conditions is employed, confinement of carriers (electrons) having energies larger than the height of the classical potential barrier $U_0$ is realized.

Accordingly, in the visible light semiconductor laser diode shown in FIG. 1(a), since the MQB structure 10 is interposed between the active layer 3 and the p type AlGaInP cladding layer 4, unwanted overflow of electrons from the active layer 3 to the p type cladding layer 4 is suppressed, whereby a reduced threshold current and an improved temperature characteristic are realized although the carrier concentration of the p type cladding layer is not increased.

The degree of the reduction in the threshold current and the degree of the improvement in the temperature characteristic of the visible light semiconductor laser diode are increased with an increase in the height of the effective potential barrier produced by the MQB structure. Therefore, it is important to design the MQB structure so that the height of the effective potential barrier is as high as possible.

The inventors of the present invention calculated electron reflectivities of an MQB structure comprising a plurality of $Ga_{0.5}In_{0.5}P$ well layers and a plurality of $(Al_{0.5}Ga_{0.3})_{0.5}In_{0.5}P$ barrier layers using a method disclosed in, for example, *Applied Physics Letters*, Volume 22, 1973, pages. 562–564, by R. Tsu and L. Esaki.

The employed MQB structure comprises an $(Al_{0.5}Ga_{0.3})_{0.5}In_{0.5}P$ first barrier layer (tunneling preventing layer) having a thickness of 80 MLs and a superlattice layer in which a plurality of $Ga_{0.5}In_{0.5}P$ well layers having the same thickness and a plurality of $(Al_{0.7}Ga_{0.3})_{0.5}In_{0.5}P$ barrier layers having the same thickness are alternatingly laminated. The superlattice layer is in contact with a side of the tunneling preventing layer opposite from an electron incident side of that layer. In this structure, reflectivities are calculated while varying the thickness of the barrier layer and the thickness of the well layer from 0.58 nm (=2 MLs) to 3.36 nm (=12 MLs).

The result of the calculation shows the following tendency.

1) When both of the barrier layer and the well layer included in the superlattice structure are 2–3 MLs thick, since resonant tunneling occurs due to a mini-band formed in each well, the effect of increasing the potential barrier with the MQB structure is not obtained.

2) In the MQB structure, the energy range where the electron reflectivity is high is significantly varied, not by variation in the well layer thickness, but by variation in the barrier layer thickness.

3) In a case where the thickness of the well layer is fixed, when the barrier layer is thin, a reflectivity of about 100% is maintained even in a region where the electron energy is about 4 times as high as the height of the classical potential barrier $U_0$ although tunneling of electrons occurs on the lower energy side. On the other hand, when the barrier layer is thick, the tunneling of electrons on the lower energy side is suppressed.

4) When the thickness of the well layer is equivalent to 4 MLs, the height of the effective potential barrier is increased most.

FIGS. 2 to 6 are graphs illustrating calculated electron reflectivities of the MQB structure in which the thickness of the well layer is fixed at 4 MLs and the thickness of the barrier layer is varied and is 2 MLs, 3 MLs, 4 MLs, 5 MLs, and 6 MLs.

Figure 2:
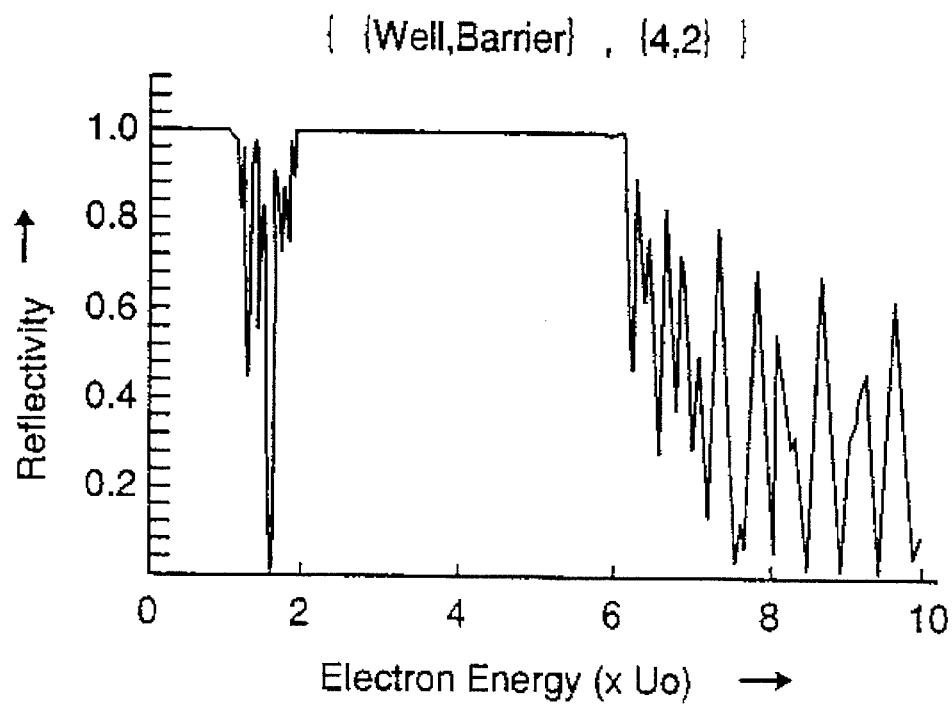
FIG. 2 is a graph illustrating calculated electron reflectivities in a superlattice structure in which four or more $Ga_{0.5}In_{0.5}P$ well layers each having a thickness of 4 MLs and four or more $(Al_{0.7}Ga_{0.3})_{0.5}In_{0.5}P$ barrier layers each having a thickness of 2 MLs are alternatingly laminated.

When the results of the calculation are examined, the following facts are discovered. First of all, as shown in FIG. 2, when the thickness of the barrier layer is 0.50 nm (=2 MLs), a reflectivity of about 100% is maintained until the electron energy exceeds $6 \times U_0$ although tunneling of electrons occurs in a region where the electron energy is 1–2 $\times U_0$.

Figure 3:
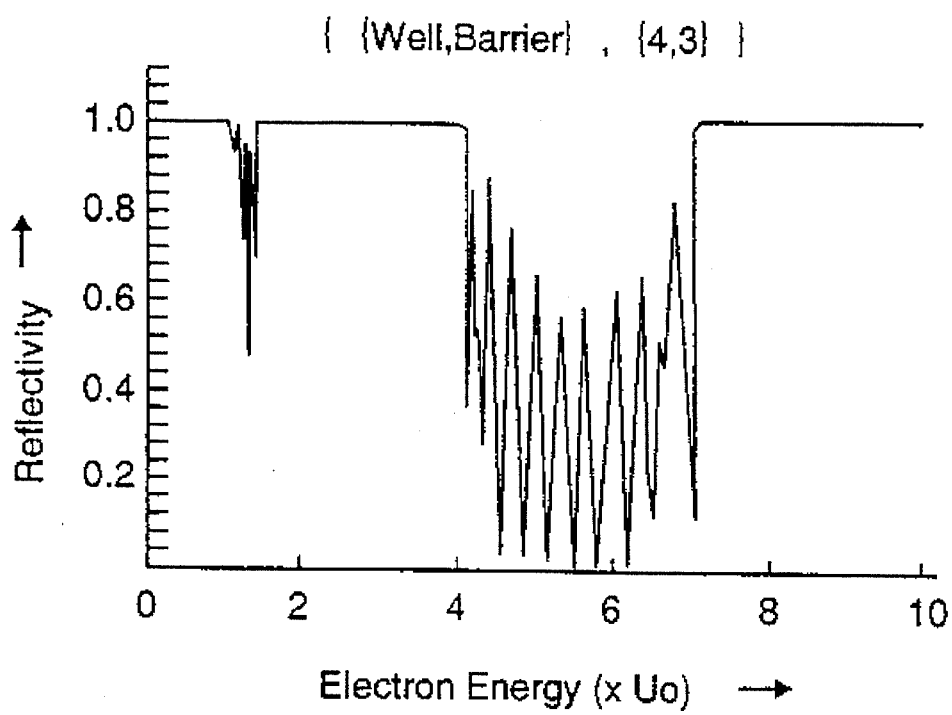
FIG. 3 is a graph illustrating calculated electron reflectivities in a superlattice structure in which four or more $Ga_{0.5}In_{0.5}P$ well layers each having a thickness of 4 MLs and four or more $(Al_{0.5}Ga_{0.3})_{0.5}In_{0.5}P$ barrier layers each having a thickness of 3 MLs are alternatingly laminated.

When the thickness of the barrier layer is 0.86 nm (=3 MLs), as shown in FIG. 3, a reflectivity of about 100% is maintained until the electron energy exceeds $4 \times U_0$ although tunneling of electrons occurs in a region where the electron energy is 1–2 $\times U_0$. Although tunneling of electrons occurs in a region where the electron energy is 4–7$\times U_0$, a reflectivity of about 100% is again obtained in a region where the electron energy exceeds 7$\times U_0$.

Figure 4:
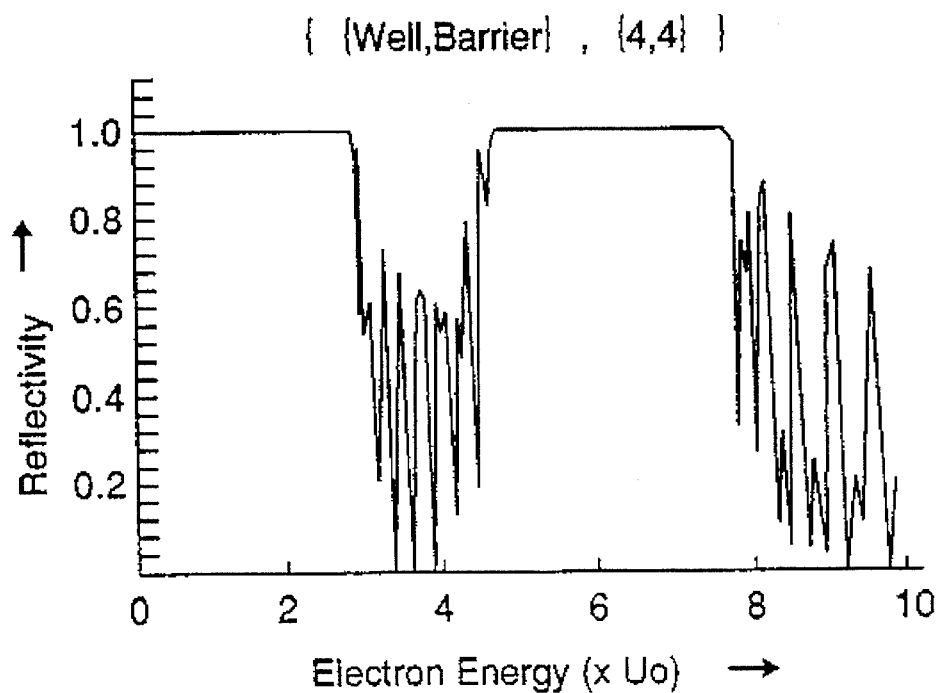
FIG. 4 is a graph illustrating calculated electron reflectivities in a superlattice structure in which four or more $Ga_{0.5}In_{0.5}P$ well layers each having a thickness of 4 MLs and four or more $(Al_{0.5}Ga_{0.3})_{0.5}In_{0.5}P$ barrier layers each having a thickness of 4 MLs are alternatingly laminated.

When the thickness of the barrier layer is 1.15 nm (=4 MLs), as shown in FIG. 4, the electron reflectivity is about 100% in a region where the electron energy is lower than $3 \times U_0$. Although tunneling of electrons occurs in a region where the electron energy is 3–5$\times U_0$, a reflectivity of about 100% is obtained in a region where the electron energy is 5–8$\times U_0$.

Figure 5:
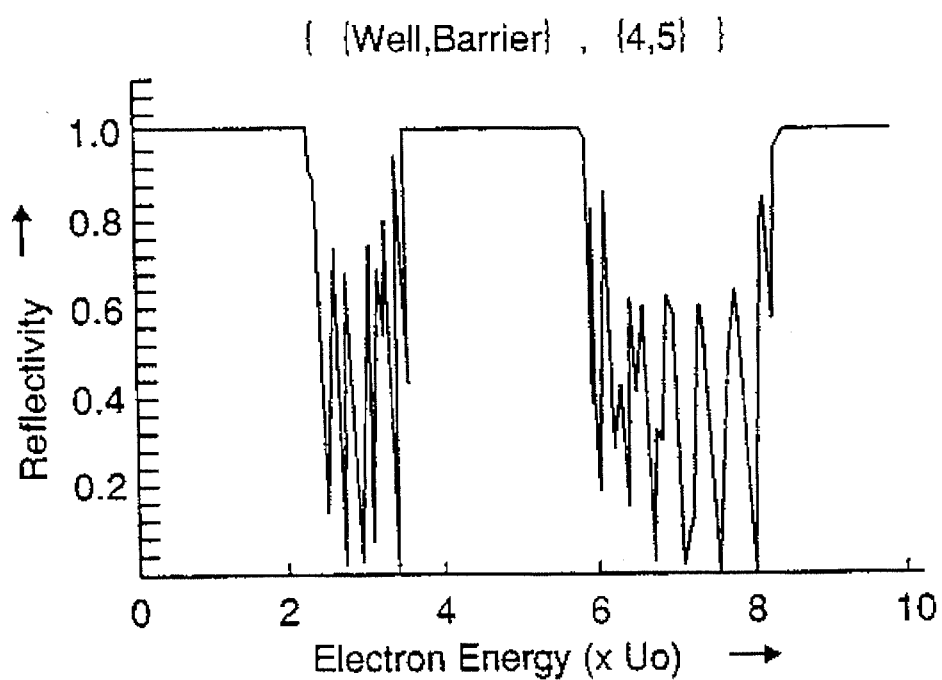
FIG. 5 is a graph illustrating calculated electron reflectivities in a superlattice structure in which four or more $Ga_{0.5}In_{0.5}P$ well layers each having a thickness of 4 MLs and four or more $(Al_{0.7}Ga_{0.3})_{0.5}In_{0.5}P$ barrier layers each having a thickness of 5 MLs are alternatingly laminated.

Further, when the thickness of the barrier layer is 1.44 nm (=5 MLs), as shown in FIG. 5, the electron reflectivity is about 100% in a region where the electron energy is lower than $2.5 \times U_0$. Although tunneling of electrons occurs in a region where the electron energy is 2.5–4$\times U_0$, a reflectivity of about 100% is obtained in a region where the electron energy is 4–6$\times U_0$. Although tunneling of electrons occurs in a region where the electron energy is 6–8.5$\times U_0$, the reflectivity again reaches about 100% when the electron energy exceeds 8.5$\times U_0$.

Figure 6:
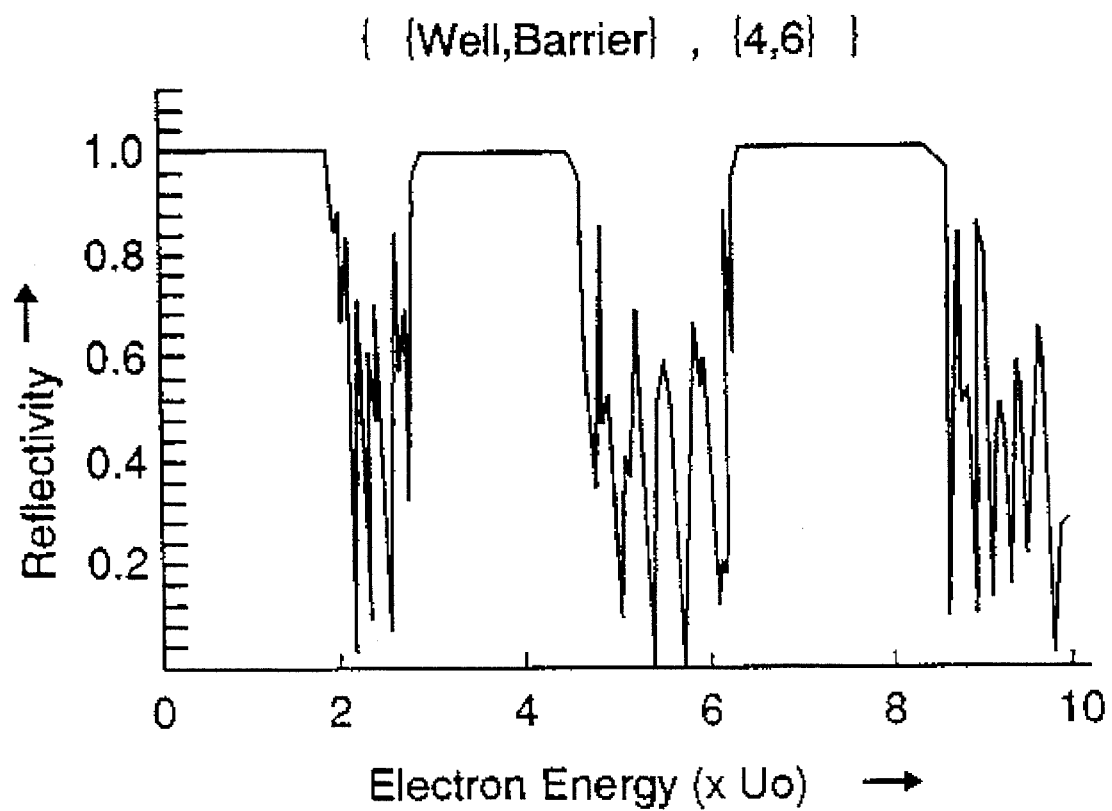
FIG. 6 is a graph illustrating calculated electron reflectivities in a superlattice structure in which four or more $Ga_{0.5}In_{0.5}P$ well layers each having a thickness of 4 MLs and four or more $(Al_{0.5}Ga_{0.3})_{0.5}In_{0.5}P$ barrier layers each having a thickness of 6 MLs are alternatingly laminated.

When the thickness of the barrier layer is 1.73 nm (=6 MLs), as shown in FIG. 6, the electron reflectivity is about 100% in a region where the electron energy is lower than $2 \times U_0$. Although tunneling of electrons occurs in a region where the electron energy is 2–3$\times U_0$, a reflectivity of about 100% is obtained in a region where the electron energy is 3–4.5$\times U_0$. Although tunneling of electrons occurs in a region where the electron energy is 4.5–6.5 $\times U_0$, a reflectivity of about 100% is obtained in a region where the electron energy is 6.5–8.5$\times U_0$.

Assuming that an MQB structure including barrier layers 0.58 nm (=2 MLs) thick (hereinafter referred to as MQB structure A) is connected to an MQB structure including barrier layers 1.15 nm (=4 MLs) thick (hereinafter referred to as MQB structure B), although tunneling of electrons occurs in a region of 3–5$\times U_0$ in the MQB structure A, the electron reflectivity is 100% in that region in the MQB structure B. On the other hand, although tunneling of electrons occurs in a region of 3–5$\times U_0$ in the MQB structure B, the electron reflectivity is 100% in that region in the MQB structure A. In this way, one MQB structure compensates for a low reflectivity part of the other MQB structure. As a whole, a reflectivity of about 100% is maintained until the electron energy reaches 8$\times U_0$.

As described above, in the present invention, a superlattice structure in which a plurality of well layers having the same thickness and a plurality of barrier layers having the same thickness are alternatingly laminated is taken as one unit, and a first superlattice structure having a low reflectivity region is combined with a second superlattice structure having a high reflectivity in the low reflectivity region of the first superlattice structure, whereby an MQB structure having a high reflectivity to a high electron energy is realized. This is a fundamental idea of the present invention.

Embodiment 1

Figure 7:
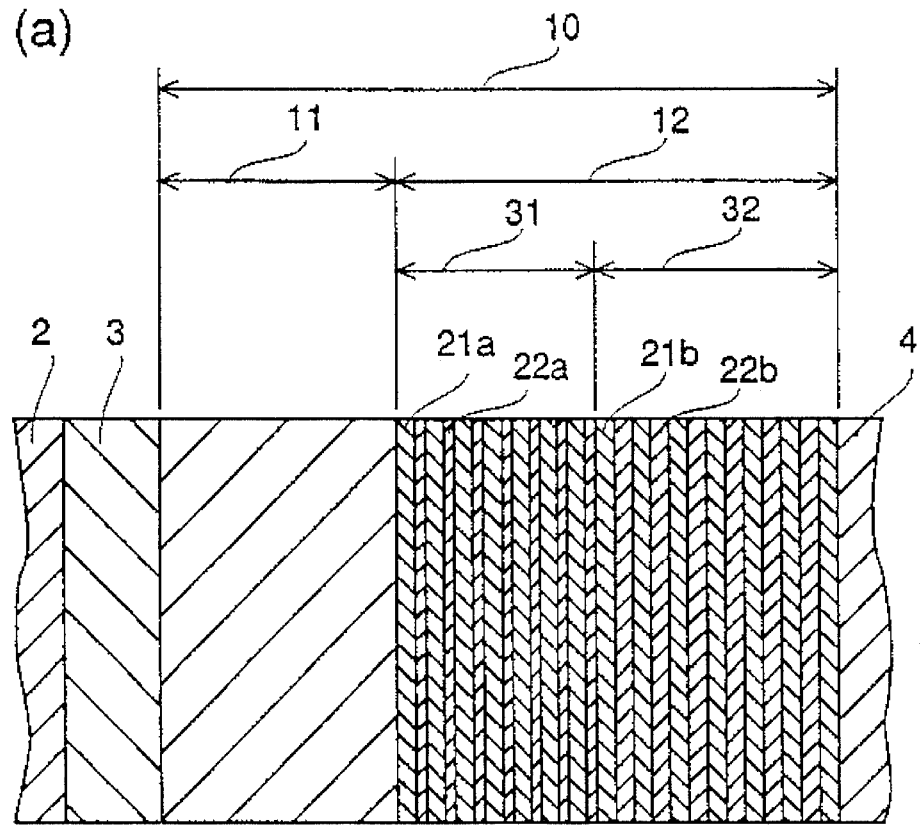
FIG. 7(a) is a schematic diagram illustrating an MQB structure according to a first embodiment of the present invention.
FIG. 7(b) is an energy band diagram of the conduction band edge of the MQB structure.
Figure 7:
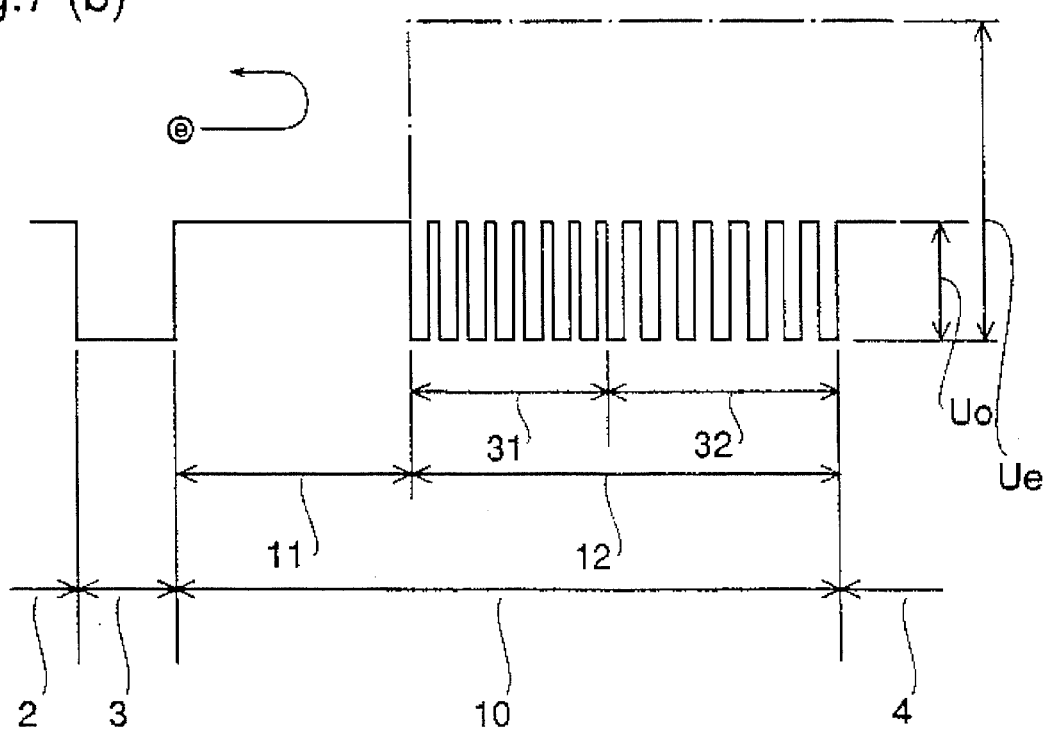

FIG. 7(a) is a schematic diagram of an MQB structure used in the visible light semiconductor laser diode shown in FIGS. 1(a) and 1(b) according to a first embodiment of the present invention, and FIG. 7(b) is an energy band diagram showing a conduction band edge of the MQB structure.

In the first embodiment of the invention, a superlattice structure 12 is disposed in contact with a first barrier layer (tunneling preventing layer) 11 having a thickness equivalent to 80 MLs. The superlattice structure 12 comprises a first superlattice layer 31 and a second superlattice layer 32. The first superlattice layer 31 comprises a plurality of $Ga_{0.5}In_{0.5}P$ well layers 21a each having a thickness equivalent to 4 MLs (=1.15 nm) and a plurality of $(Al_{0.5}Ga_{0.3})_{0.5}In_{0.5}P$ barrier layers 22a each having a thickness equivalent to 2 MLs (=0.58 nm), the well and barrier layers being alternatingly laminated. The second superlattice layer 32 comprises a plurality of $Ga_{0.5}In_{0.5}P$ well layers 21b each having a thickness equivalent to 4 MLs and a plurality of $(Al_{0.5}Ga_{0.3})_{0.5}In_{0.5}P$ barrier layers 22a each having a thickness equivalent to 4 MLs, the well and barrier layers being alternatingly laminated. Each superlattice layer comprises four or more well layers and four or more barrier layers.

Figure 8:
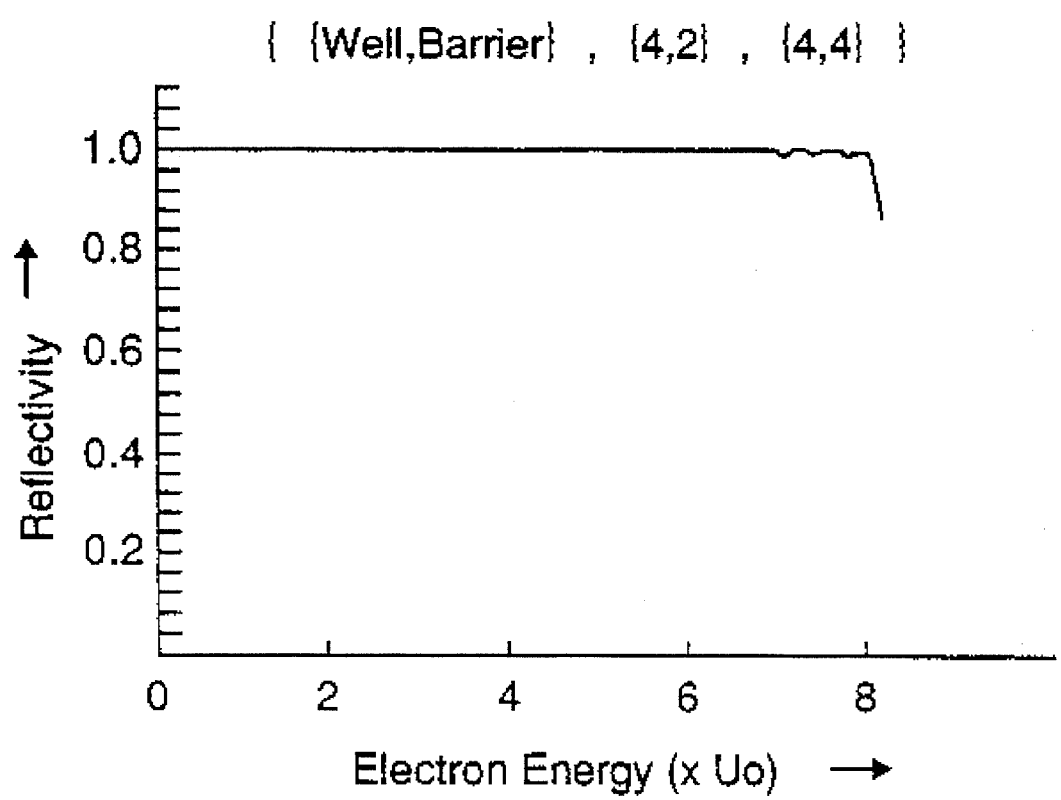
FIG. 8 is a graph illustrating calculated electron reflectivities in the MQB structure according to the first embodiment of the invention.

FIG. 8 is a graph illustrating calculated electron reflectivities in the MQB structure shown in FIGS. 7(a) and 7(b). As shown in FIG. 8, the height of the effective potential barrier $U_e$ according to the first embodiment of the invention is about 8 times the height of the classical potential barrier $U_0$.

According to the first embodiment of the invention, the ratio of the effective potential barrier height to the classical potential barrier height is significantly increased as compared to that of the prior art MQB structure. Therefore, when the MQB structure according to the first embodiment is employed as the MQB structure 10 interposed between the active layer 3 and the p type cladding layer 4 of the AlGaInP system visible light laser diode shown in FIGS. 1(a) and 1(b), unwanted overflow of carriers from the active layer 3 to the cladding layer 4 is significantly reduced, whereby the oscillation threshold of the laser is reduced and the output characteristics at a high temperature are improved.

Embodiment 2

Figure 9:
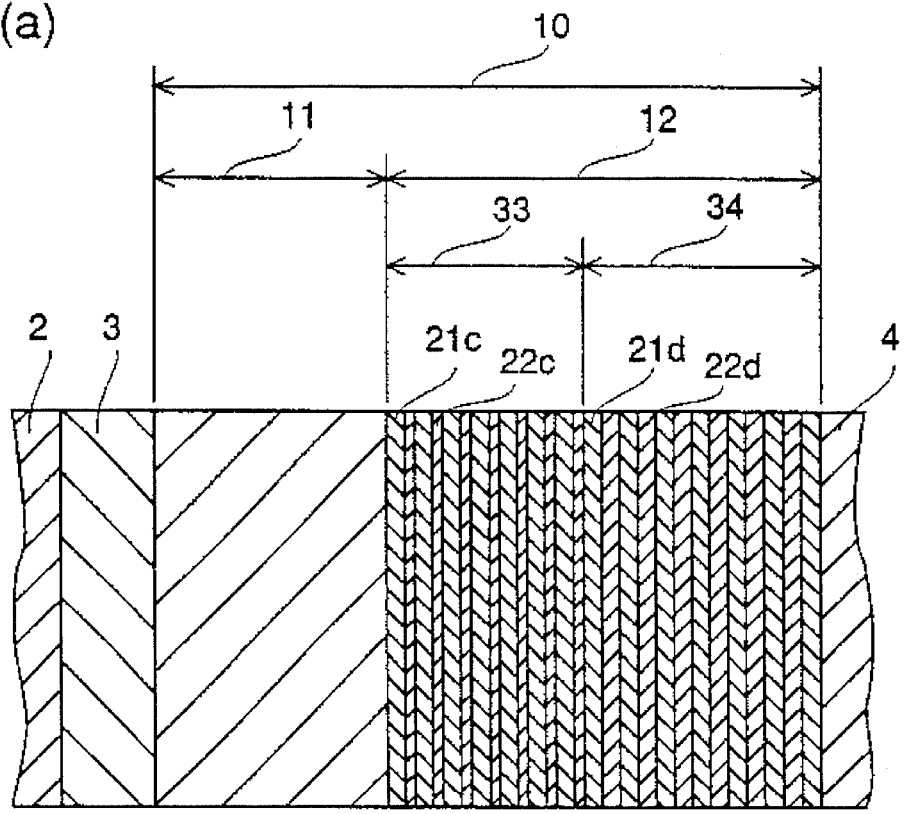
FIG. 9(a) is a schematic diagram illustrating an MQB structure according to a second embodiment of the present invention.
FIG. 9(b) is an energy band diagram of the conduction band edge of the MQB structure.
Figure 9:
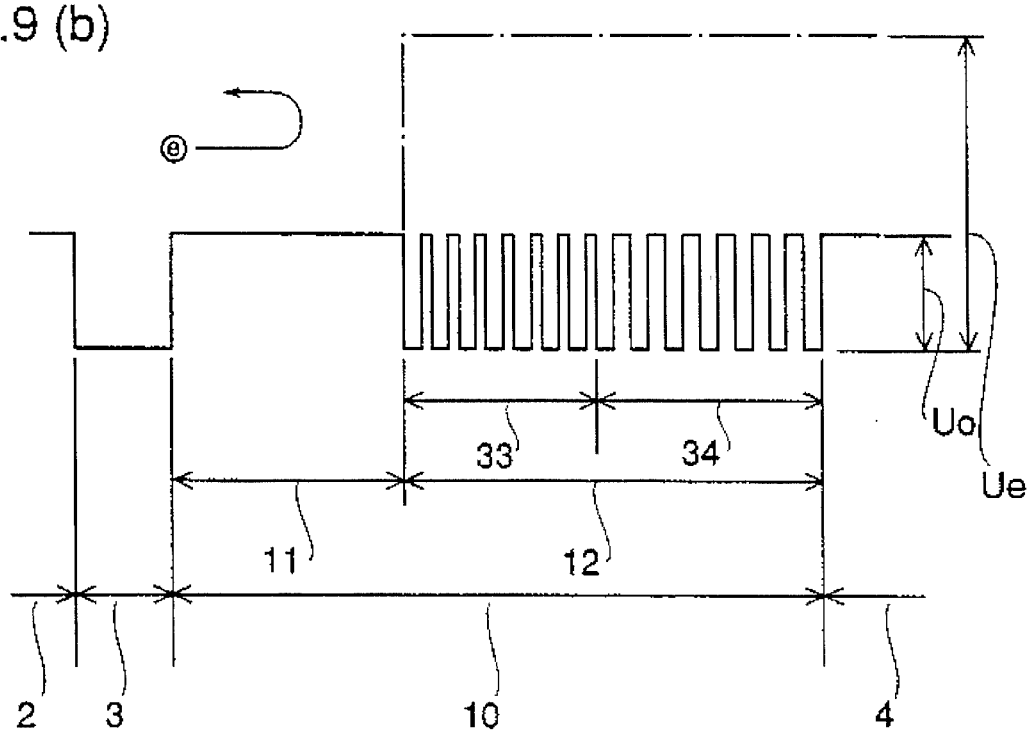

FIG. 9(a) is a schematic diagram of an MQB structure used in the visible light semiconductor laser diode shown in FIGS. 1(a) and 1(b) according to a second embodiment of the present invention, and FIG. 9(b) is an energy band diagram showing a conduction band of the MQB structure.

In the second embodiment of the invention, the superlattice structure 12 disposed in contact with the first barrier layer (tunneling preventing layer) 11 having a thickness equivalent to 80 MLs comprises a first superlattice layer 33 and a second superlattice layer 34. The first superlattice layer 33 comprises a plurality of $Ga_{0.5}In_{0.5}P$ well layers 21c each having a thickness equivalent to 4 MLs and a plurality of $(Al_{0.5}Ga_{0.3})_{0.5}In_{0.5}P$ barrier layers 22c each having a thickness equivalent to 3 MLs (=0.86 nm), the well and barrier layers being alternatingly laminated. The second superlattice layer 34 comprises a plurality of $Ga_{0.5}In_{0.5}P$ well layers 21d each having a thickness equivalent to 4 MLs and a plurality of $(Al_{0.5}Ga_{0.3})_{0.5}In_{0.5}P$ barrier layers 22d each having a thickness equivalent to 5 MLs (=1.44 nm), the well and barrier layers being alternatingly laminated. Each superlattice layer comprises four or more well layers and four or more barrier layers.

Figure 10:
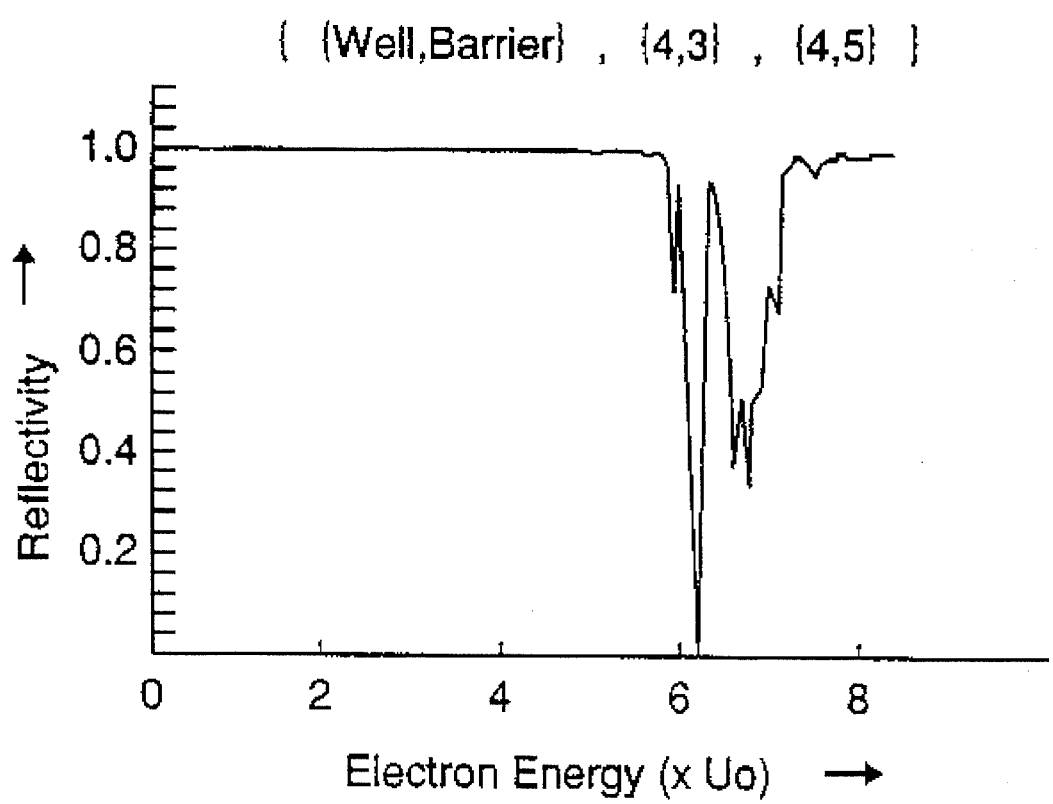
FIG. 10 is a graph illustrating calculated electron reflectivities in the MQB structure according to the second embodiment of the invention.

FIG. 10 is a graph illustrating calculated electron reflectivities in the MQB structure shown in FIGS. 9(a) and 9(b). As shown in FIG. 10, the height of the effective potential barrier $U_e$ according to the second embodiment of the invention is about 6 times the height of the classical potential barrier $U_0$.

According to the second embodiment of the invention, the ratio of the effective potential barrier height to the classical potential barrier height is significantly increased as compared to that of the prior art MQB structure. Therefore, when the MQB structure according to this second embodiment is employed as the MQB structure 10 interposed between the active layer 3 and the p type cladding layer 4 of the AlGaInP system visible light laser diode shown in FIGS. 1(a) and 1(b), unwanted overflow of carriers from the active layer 3 to the cladding layer 4 is significantly reduced, whereby the oscillation threshold of the laser is reduced and the output characteristics at a high temperature are improved.

Embodiment 3

Figure 11:
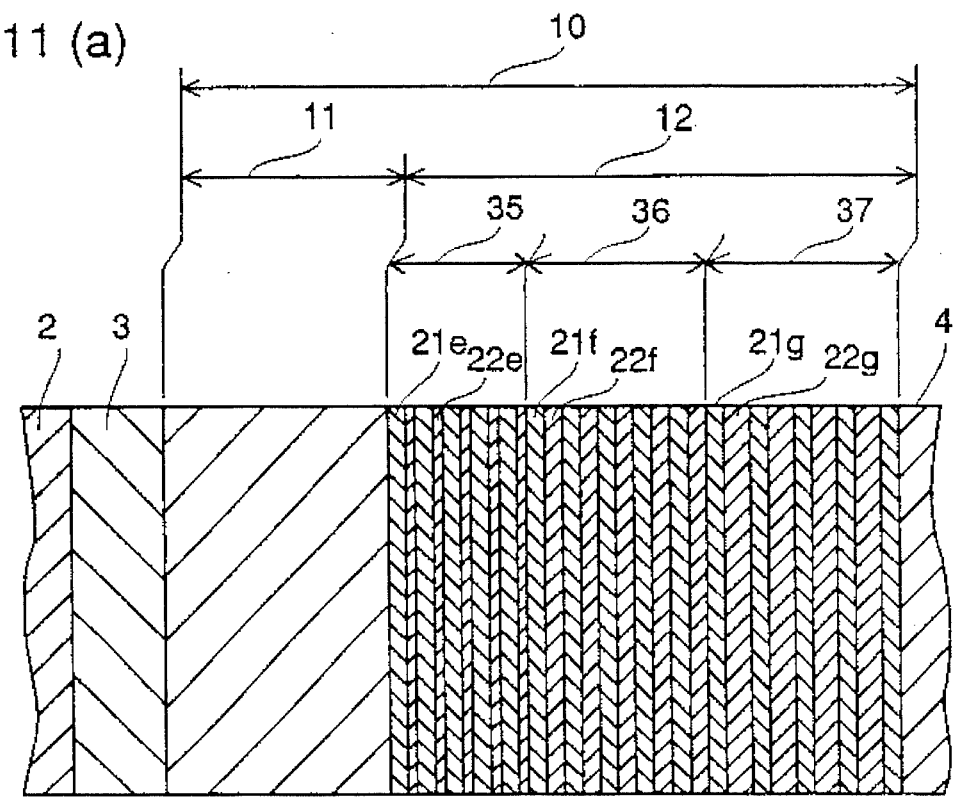
FIG. 11(a) is a schematic diagram illustrating an MQB structure according to a third embodiment of the present invention.
FIG. 11(b) is an energy band diagram of the conduction band edge of the MQB structure.
Figure 11:
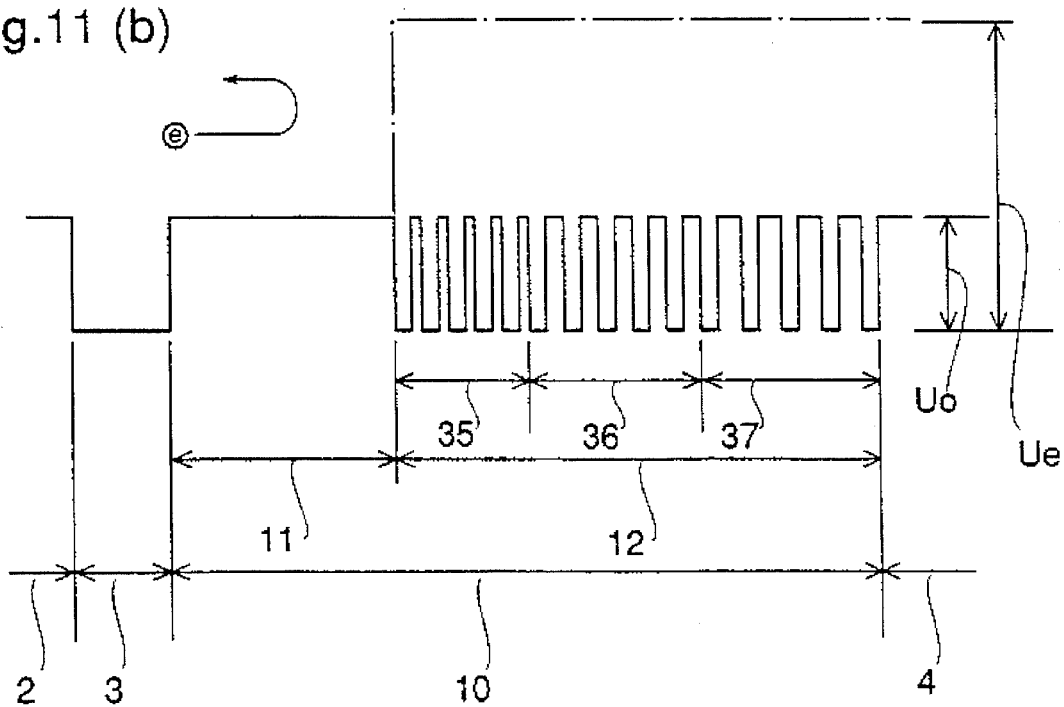

FIG. 11(a) is a schematic diagram of an MQB structure used in the visible light semiconductor laser diode shown in FIGS. 1(a) and 1(b) according to a third embodiment of the present invention, and FIG. 11(b) is an energy band diagram showing the conduction band edge of the MQB structure.

In the third embodiment of the invention, the superlattice structure 12 disposed in contact with the first barrier layer (tunneling preventing layer) 11 having a thickness equivalent to 80 MLs comprises a first superlattice layer 35, a second superlattice layer 36, and a third superlattice layer 37. The first superlattice layer 35 comprises a plurality of $Ga_{0.5}In_{0.5}P$ well layers 21e each having a thickness equivalent to 4 MLs and a plurality of $(Al_{0.5}Ga_{0.3})_{0.5}In_{0.5}P$ barrier layers 22e each having a thickness equivalent to 2 MLs (=0.58 nm). The well and barrier layers are alternatingly laminated. The second superlattice layer 36 comprises a plurality of $Ga_{0.5}In_{0.5}P$ well layers 21f each having a thickness equivalent to 4 MLs and a plurality of $(Al_{0.5}Ga_{0.3})_{0.5}In_{0.5}P$ barrier layers 22f each having a thickness equivalent to 4 MLs. The well and barrier layers are alternatingly laminated. The third superlattice layer 37 comprises a plurality of $Ga_{0.5}In_{0.5}P$ well layers 21g each having a thickness equivalent to 4 MLs and a plurality of $(Al_{0.5}Ga_{0.3})_{0.5}In_{0.5}P$ barrier layers 22g each having a thickness equivalent to 6 MLs (=1.73 nm), the well and barrier layers being alternatingly laminated. Each superlattice layer comprises four or more well layers and four or more barrier layers.

Figure 12:
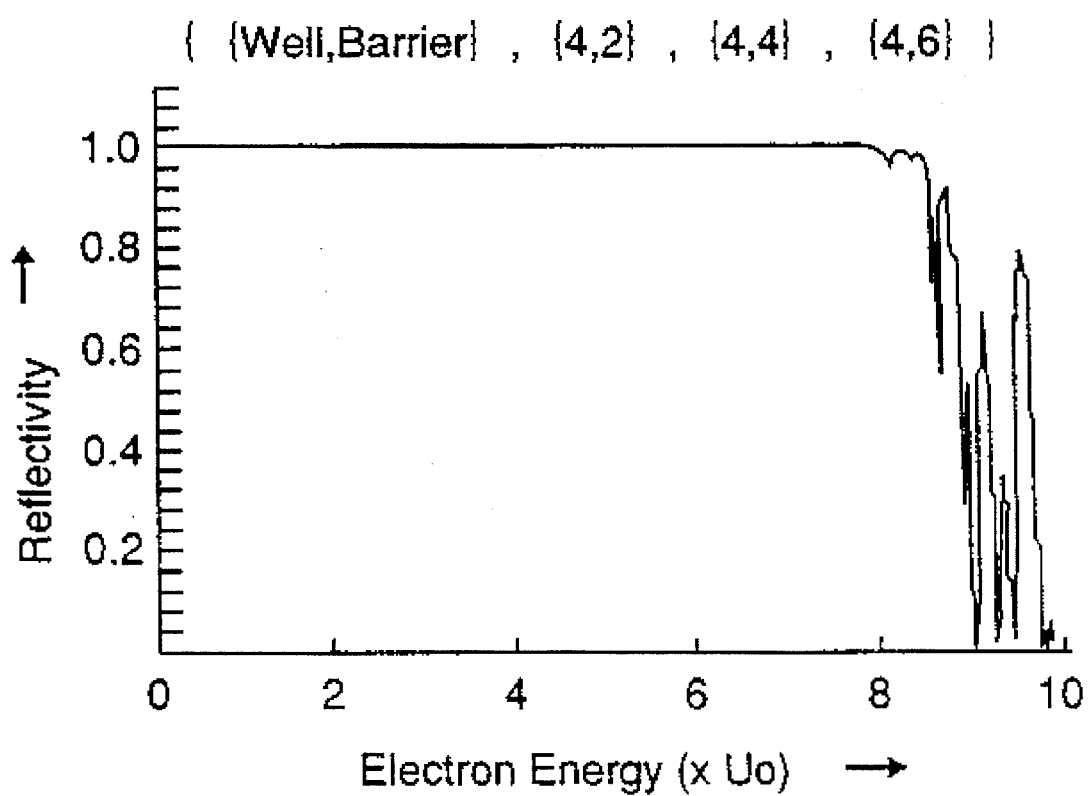
FIG. 12 is a graph illustrating calculated electron reflectivities in the MQB structure according to the third embodiment of the invention.

FIG. 12 is a graph illustrating calculated electron reflectivities in the MQB structure shown in FIGS. 11(a) and 11(b). As shown in FIG. 12, the height of the effective potential barrier $U_e$ according to the third embodiment of the invention is about 8.5 times the height of the classical potential barrier $U_0$.

According to the third embodiment of the invention, the ratio of the effective potential barrier height to the classical potential barrier height is significantly increased as compared to that of the prior art MQB structure. Therefore, when the MQB structure according to the third embodiment is employed as the MQB structure 10 interposed between the active layer 3 and the p type cladding layer 4 of the AlGaInP system visible light laser diode shown in FIGS. 1(a) and 1(b), unwanted overflow of carriers from the active layer 3 to the cladding layer 4 is significantly reduced, whereby the oscillation threshold of the laser is reduced and the output characteristics at a high temperature are improved.

Embodiment 4

Figure 13:
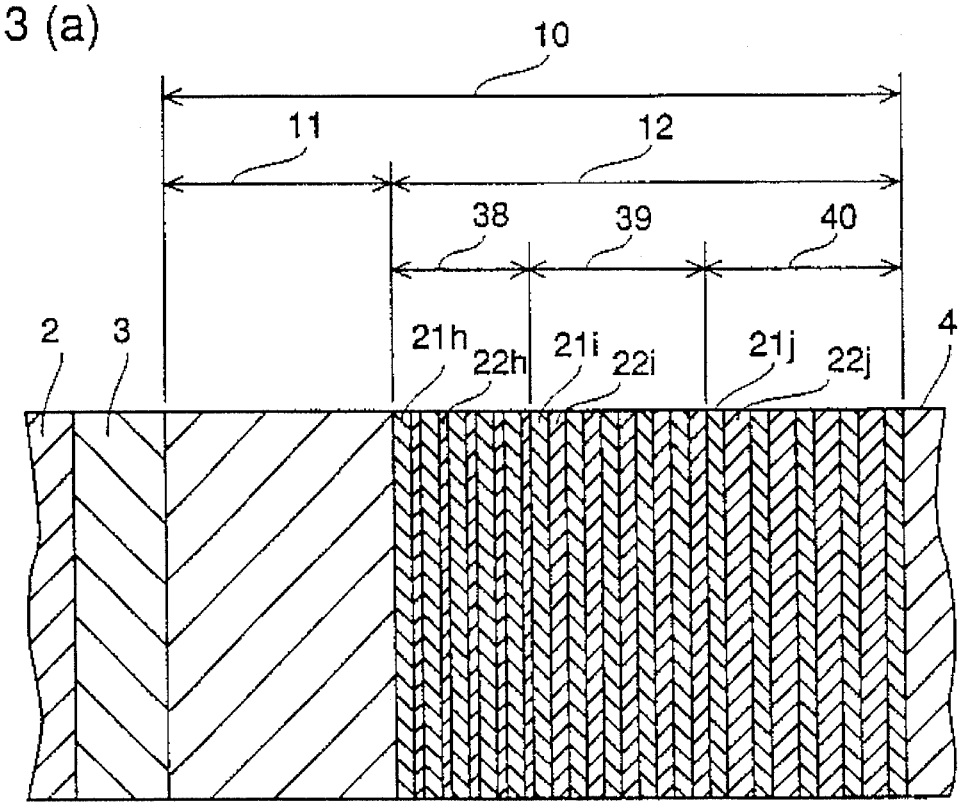
FIG. 13(a) is a schematic diagram illustrating an MQB structure according to a fourth embodiment of the present invention.
FIG. 13(b) is an energy band diagram of the conduction band edge of the MQB structure.
Figure 13:
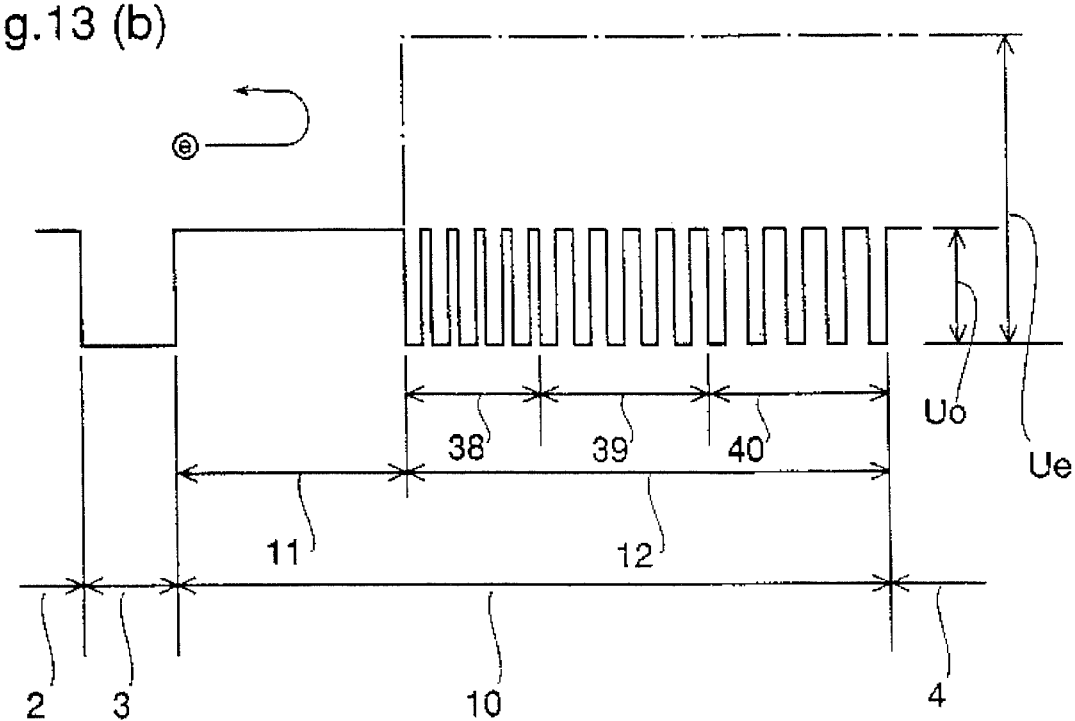

FIG. 13(a) is a schematic diagram of an MQB structure used in the visible light semiconductor laser diode shown in FIGS. 1(a) and 1(b) according to a fourth embodiment of the present invention, and FIG. 13(b) is an energy band diagram showing the conduction band edge of the MQB structure.

In the fourth embodiment of the invention, the superlattice structure 12 disposed in contact with the first barrier layer (tunneling preventing layer) 11 having a thickness equivalent to 80 MLs comprises a first superlattice layer 38, a second superlattice layer 39, and a third superlattice layer 40. The first superlattice layer 38 comprises a plurality of $Ga_{0.5}In_{0.5}P$ well layers 21h each having a thickness equivalent to 4 MLs and a plurality of $(Al_{0.5}Ga_{0.3})_{0.5}In_{0.5}P$ barrier layers 22h each having a thickness equivalent to 3 MLs (=0.86 nm), the well and barrier layers being alternately laminated. The second superlattice layer 39 comprises a plurality of $Ga_{0.5}In_{0.5}P$ well layers 21i each having a thickness equivalent to 4 MLs and a plurality of $(Al_{0.7}Ga_{0.3})_{0.5}In_{0.5}P$ barrier layers 22i each having a thickness equivalent to 4 MLs, the well and barrier layers being alternately laminated. The third superlattice layer 40 comprises a plurality of $Ga_{0.5}In_{0.5}P$ well layers 21j each having a thickness equivalent to 4 MLs and a plurality of $(Al_{0.5}Ga_{0.3})_{0.5}In_{0.5}P$ barrier layers 22j each having a thickness equivalent to 5 MLs (=1.44 nm), the well and barrier layers being alternately laminated. Each superlattice layer comprises four or more well layers and four or more barrier layers.

Figure 14:
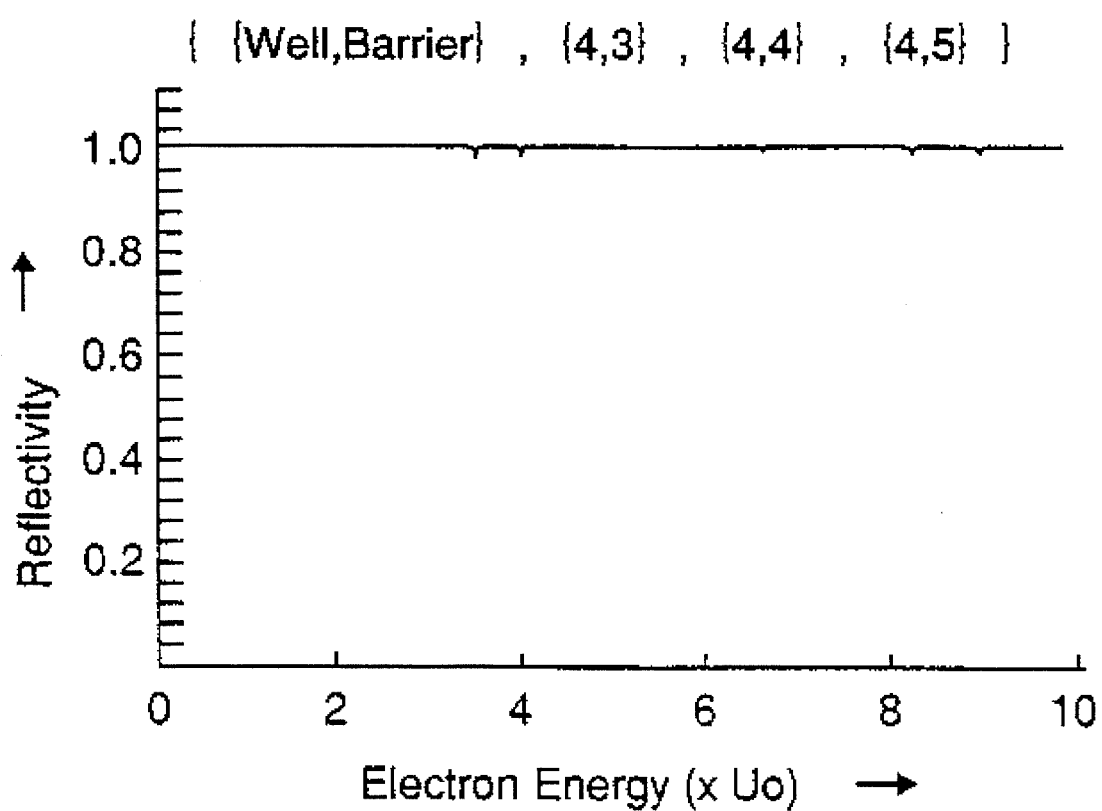
FIG. 14 is a graph illustrating calculated electron reflectivities in the MQB structure according to the fourth embodiment of the invention.
Figure 15:
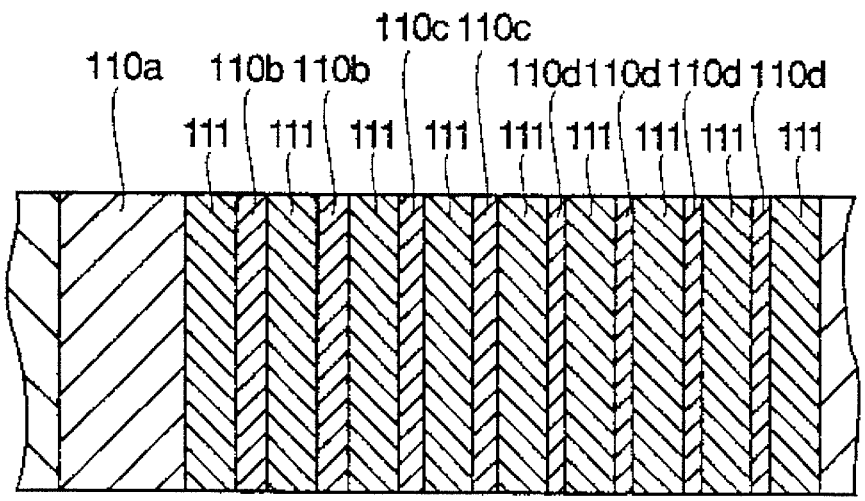
FIG. 15 is a schematic diagram of an MQB structure disclosed in Japanese Published Patent Application No. Sho. 63-46788.
Figure 16:
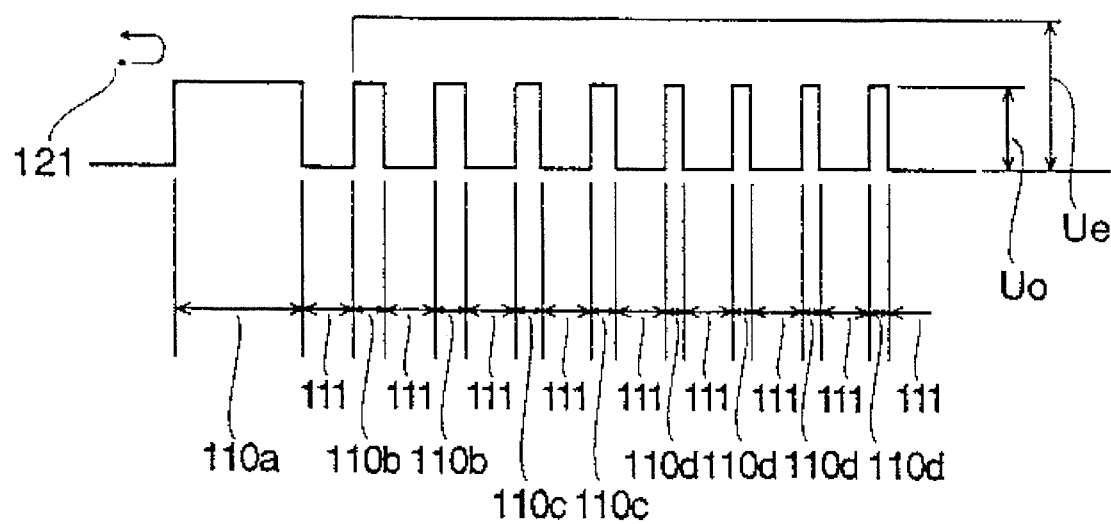
FIG. 16 is an energy band diagram of the conduction band edge of the MQB structure shown in FIG. 15.
Figure 17:
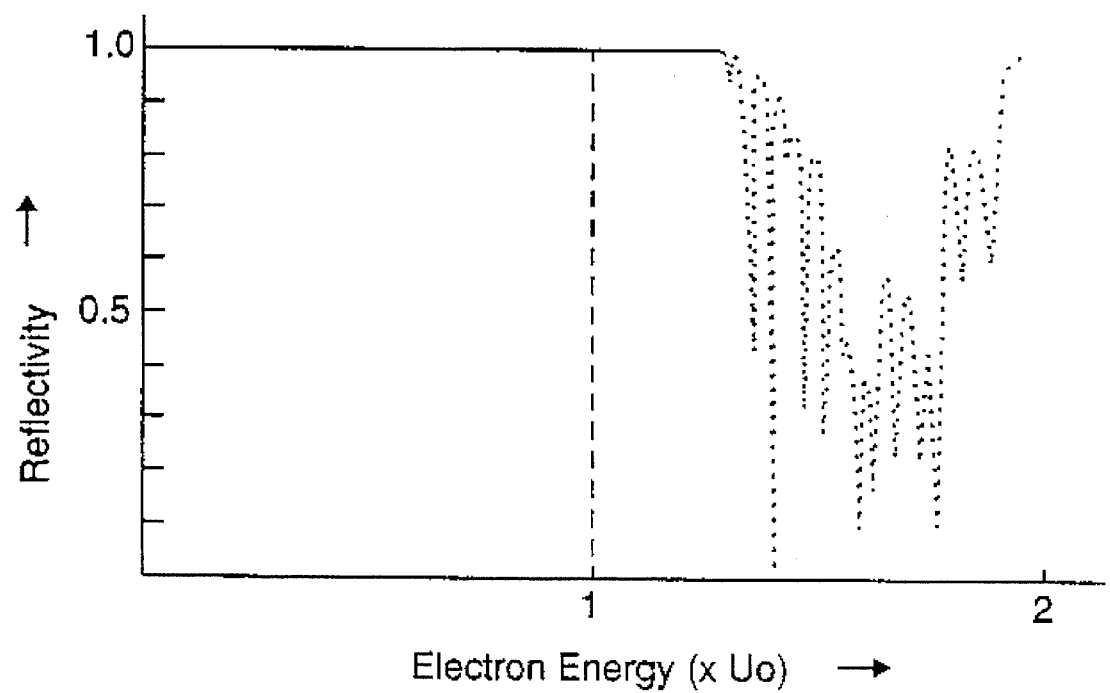
FIG. 17 is a graph illustrating calculated electron reflectivities in the MQB structure shown in FIG. 15.
Figure 18:
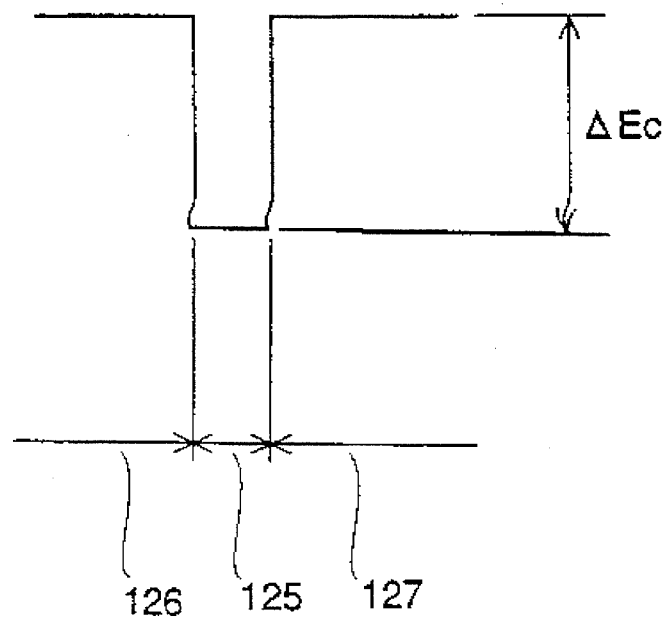
FIG. 18 is an energy band diagram of the conduction band edge of a visible light semiconductor laser diode including an $Ga_{0.5}In_{0.5}P$ active layer and an $(Al_{0.7}Ga_{0.3})_{0.5}In_{0.5}P$ cladding layer in the vicinity of the active layer.
Figure 19:
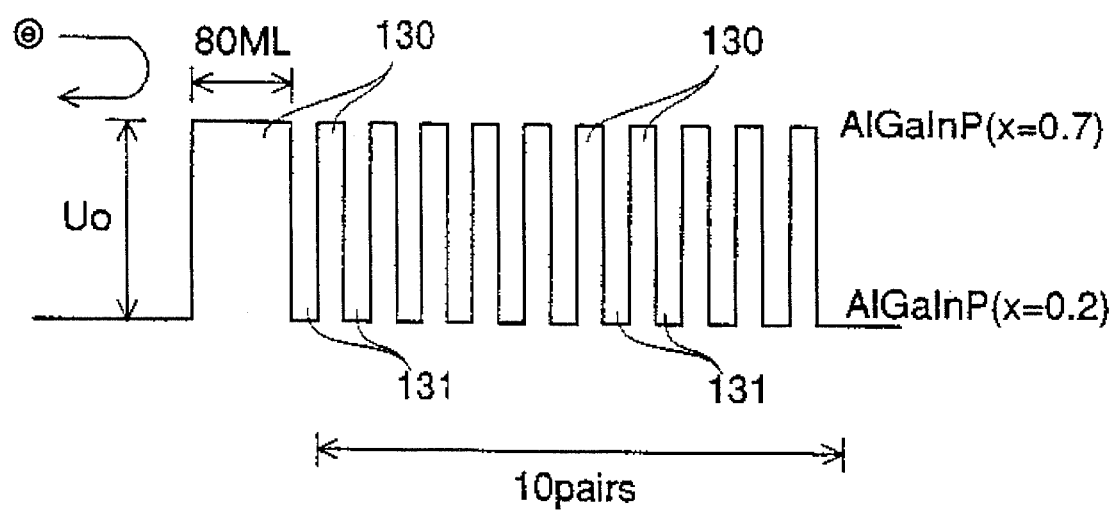
FIG. 19 is an energy band diagram of a prior art MQB structure applied to a visible light laser diode.

FIG. 14 is a graph illustrating calculated electron reflectivities in the MQB structure shown in FIGS. 13(a) and 13(b). As shown in FIG. 14, the height of the effective potential barrier $U_e$ according to the fourth embodiment of the invention is about 10 times the height of the classical potential barrier $U_0$.

According to the fourth embodiment of the invention, the ratio of the effective potential barrier height to the classical potential barrier height is significantly increased as compared to that of the prior art MQB structure. Therefore, when the MQB structure according to the fourth embodiment is employed as the MQB structure 10 interposed between the active layer 3 and the p type cladding layer 4 of the AlGaInP system visible light laser diode shown in FIGS. 1(a) and 1(b), unwanted overflow of carriers from the active layer 3 to the cladding layer 4 is significantly reduced, whereby the oscillation threshold of the laser is reduced and the output characteristics at a high temperature are improved.

In the first and second embodiments, the order of the first and second superlattice layers may be reversed, i.e., the second superlattice layer may be disposed on the active layer side. Also in this case, the same effect of confining electrons is obtained. However, the effect of confining light produced in the active layer is increased when the superlattice layer including thinner barrier layers is closer to the active layer than the superlattice layer including thicker barrier layers.

In the third and fourth embodiments, even when the order of the first and third superlattice layers is reversed, the same effect of confining electrons is obtained. However, the effect of confining light produced in the active layer is increased when the superlattice layer having thinner barrier layers is closer to the active layer than the superlattice layer having thicker barrier layers.

The combination of the superlattice layers included in the MQB structure of the present invention is not restricted to those described with respect to the first to fourth embodiments so long as a low reflectivity part of a superlattice layer is compensated by another superlattice layer to provide a high reflectivity to a high electron energy.

In the first to fourth embodiments, all of the well layers included in the superlattice layers are equivalent in thickness to 4 MLs because the 4 MLs thick well layers provide the highest effective potential barrier. However, even when the thickness of the well layer is not equivalent to 4 MLS, an MQB structure having an effective potential barrier much higher than that of the prior art MQB structure is realized by appropriately selecting a superlattice layer.

What is claimed is:

1. A multiquantum barrier structure including a superlattice structure in which a plurality of well layers and a plurality of barrier layers are alternatingly laminated, said superlattice structure comprising:

a first superlattice layer comprising at least four $Ga_{0.5}In_{0.5}$ well layers each well layer being four monolayers thick, and at least four $(Al_{0.7}Ga_{0.3})_{0.5}In_{0.5}P$ barrier layers, each barrier layer being two monolayers thick, said well layers and barrier layers being alternatingly arranged, said first superlattice layer having a first electron reflectivity in an electron energy region; and a second superlattice layer disposed continuously with the first superlattice layer and comprising at least four $Ga_{0.5}In_{0.5}P$ well layers, each well layer being four monolayers thick, and at least four $(Al_{0.7}Ga_{0.3})_{0.5}In_{0.5}P$ barrier layers, each barrier layer being four monolayers thick, said well layers and barrier layers being alternatingly arranged, said second superlattice layer having a second electron reflectivity, higher than the first electron reflectivity, in the electron energy region where the first superlattice structure has the first electron reflectivity.

2. A multiquantum barrier structure including a superlattice structure in which a plurality of well layers and a plurality of barrier layers are alternatingly laminated, said superlattice structure comprising:

a first superlattice layer comprising at least four $Ga_{0.5}In_{0.5}P$ well layers, each well layer being four monolayers thick, and at least four $(Al_{0.7}Ga_{0.3})_{0.5}In_{0.5}P$ barrier layers, each barrier layer being three monolayers thick, said well layers and barrier layers being alternatingly arranged, said first superlattice layer having a first electron reflectivity in an electron energy region; and a second superlattice layer disposed continuously with the first superlattice layer and comprising at least four $Ga_{0.5}In_{0.5}P$ well layers, each well layer being four monolayers thick, and at least four $(Al_{0.7}Ga_{0.3})_{0.5}In_{0.5}P$ barrier layers, each barrier layer being five monolayers thick, said well layers and barrier layers being alternatingly arranged, said second superlattice layer having a second electron reflectivity, higher than the first electron reflectivity, in the electron energy region where the first superlattice structure has the first electron reflectivity.

3. A multiquantum barrier structure including a superlattice structure in which a plurality of well layers and a plurality of barrier layers are alternatingly laminated, said superlattice structure comprising:

a first superlattice layer comprising at least four $Ga_{0.5}In_{0.5}P$ well layers, each well layer being four monolayers thick, and at least four $(Al_{0.7}Ga_{0.3})_{0.5}In_{0.5}P$ barrier layers, each barrier layer being two monolayers thick, said well layers and barrier layers being alternatingly arranged, said first superlattice layer having a first electron reflectivity in an electron energy region;

a second superlattice layer disposed continuously with the first superlattice layer and comprising at least four $Ga_{0.5}In_{0.5}P$ well layers, each well layer being four monolayers thick, and at least four $(Al_{0.7}Ga_{0.3})_{0.5}In_{0.5}P$ barrier layers, each barrier layer being four monolayers thick, said well layers and barrier layers being alternatingly arranged, said second superlattice layer having a second electron reflectivity, higher than the first electron reflectivity, in the electron energy region where the first superlattice structure has the first electron reflectivity; and a third superlattice layer disposed continuously with the second superlattice layer and comprising at least four $Ga_{0.5}In_{0.5}P$ well layers, each well layer being four monolayers thick, and at least four $(Al_{0.7}Ga_{0.3})_{0.5}In_{0.5}P$ barrier layers, each barrier layer being six monolayers thick, said well layers and barrier layers being alternatingly arranged, said third superlattice layer having a third electron reflectivity, higher than the first electron reflectivity, in the electron energy region where the first superlattice structure has the first electron reflectivity.

4. A multiquantum barrier structure including a superlattice structure in which a plurality of well layers and a plurality of barrier layers are alternatingly laminated, said superlattice structure comprising:

a first superlattice layer comprising at least four $Ga_{0.5}In_{0.5}P$ well layers, each well layer being four monolayers thick, and at least four $(Al_{0.7}Ga_{0.3})_{0.5}In_{0.5}P$ barrier layers, each barrier layer being three monolayers thick, said well layers and barrier layers being alternatingly arranged, said first superlattice layer having a first electron reflectivity in an electron energy region;

a second superlattice layer disposed continuously with the first superlattice layer and comprising at least four $Ga_{0.5}In_{0.5}P$ well layers, each well layer being four monolayers thick, and at least four $(Al_{0.7}Ga_{0.3})_{0.5}In_{0.5}P$ barrier layers, each barrier layer being four monolayers thick, said well layers and barrier layers being alternatingly arranged, said second superlattice layer having a second electron reflectivity, higher than the first electron reflectivity, in the electron energy region where the first superlattice structure has the first electron reflectivity; and a third superlattice layer disposed continuously with the second superlattice layer and comprising at least four $Ga_{0.5}In_{0.5}P$ well layers, each well layer being four monolayers thick, and at least four $(Al_{0.7}Ga_{0.3})_{0.5}In_{0.5}P$ barrier layers, each barrier layer being five monolayers thick, said well layers and barrier layers being alternatingly arranged, said third superlattice layer having a third electron reflectivity, higher than the first electron reflectivity, in the electron energy region where the first superlattice structure has the first electron reflectivity.

* * * * *

UNITED STATES PATENT AND TRADEMARK OFFICE
CERTIFICATE OF CORRECTION

PATENT NO. : 5,544,187
DATED : August 6, 1996
INVENTOR(S) : Kadoiwa et al.

It is certified that error appears in the above-indentified patent and that said Letters Patent is hereby corrected as shown below:

Column 12, Line 6, change "$Ga_{0.5}In_{0.5}$" to

--$Ga_{0.5}In_{0.5}P$--;

Line 7, after "layers" insert --,--.

Signed and Sealed this

Twenty-fourth Day of December, 1996

Attest:

BRUCE LEHMAN

Attesting Officer                Commissioner of Patents and Trademarks